(12) United States Patent
Kitagawa et al.

(10) Patent No.: US 10,062,520 B2
(45) Date of Patent: Aug. 28, 2018

(54) PHOTO-ELECTROCHEMICAL CELL, MANUFACTURING METHOD OF PHOTO-ELECTROCHEMICAL CELL, AND PHOTO-ELECTROCHEMICAL REACTION DEVICE

(71) Applicant: Kabushiki Kaisha Toshiba, Minato-ku (JP)

(72) Inventors: Ryota Kitagawa, Setagaya (JP); Yoshitsune Sugano, Kawasaki (JP); Chingchun Huang, Ota (JP); Eishi Tsutsumi, Kawasaki (JP); Jun Tamura, Yokohama (JP); Akihiko Ono, Kita (JP); Yuki Kudo, Yokohama (JP); Satoshi Mikoshiba, Yamato (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 88 days.

(21) Appl. No.: 15/249,900

(22) Filed: Aug. 29, 2016

(65) Prior Publication Data

US 2016/0372271 A1 Dec. 22, 2016

Related U.S. Application Data

(63) Continuation of application No. PCT/JP2015/001215, filed on Mar. 6, 2015.

(30) Foreign Application Priority Data

Mar. 24, 2014 (JP) .................................. 2014-059594
May 19, 2014 (JP) .................................. 2014-103188

(51) Int. Cl.
*C25B 1/00* (2006.01)
*C25B 9/08* (2006.01)
(Continued)

(52) U.S. Cl.
CPC ............. *H01G 9/2027* (2013.01); *C25B 1/00* (2013.01); *C25B 1/003* (2013.01); *C25B 1/06* (2013.01);
(Continued)

(58) Field of Classification Search
CPC .. C25B 1/00; C25B 1/003; C25B 9/08; C25B 1/06; C25B 9/066; C25B 11/0405;
(Continued)

(56) References Cited

U.S. PATENT DOCUMENTS

| | | |
|---|---|---|
| 5,785,768 A | 7/1998 | Nakata |
| 6,887,728 B2 | 5/2005 | Miller et al. |

(Continued)

FOREIGN PATENT DOCUMENTS

| | | |
|---|---|---|
| AT | 412 002 | 8/2004 |
| JP | 8-125210 | 5/1996 |

(Continued)

OTHER PUBLICATIONS

Michael J. Kenney, et al., "High-Performance Silicon Photoanodes Passivated with Ultrathin Nickel Films for Water Oxidation", Science. vol. 342, Nov. 15, 2013, pp. 836-840.

(Continued)

*Primary Examiner* — Ciel P Thomas
(74) *Attorney, Agent, or Firm* — Oblon, McClelland, Maier & Neustadt, L.L.P.

(57) ABSTRACT

A photo-electrochemical cell of an embodiment includes: a first electrode which has a transparent conductive film provided on a first surface of a photoelectric conversion layer; a first catalyst layer provided on the first electrode; a second electrode provided on a second surface of the photoelectric conversion layer; and a second catalyst layer provided on the second electrode. The first catalyst layer has a plurality of catalyst parts disposed on the first electrode (Continued)

and a transparent dielectric part disposed in a gap between the plurality of catalyst parts.

16 Claims, 8 Drawing Sheets

(51) Int. Cl.

| | | |
|---|---|---|
| C25B 1/06 | (2006.01) | |
| C25B 11/04 | (2006.01) | |
| C25D 5/54 | (2006.01) | |
| C25D 9/04 | (2006.01) | |
| C25D 5/02 | (2006.01) | |
| C25D 7/12 | (2006.01) | |
| C25D 9/08 | (2006.01) | |
| C25D 9/10 | (2006.01) | |
| C25D 11/10 | (2006.01) | |
| C25D 11/02 | (2006.01) | |
| H01G 9/20 | (2006.01) | |
| B82Y 40/00 | (2011.01) | |
| C25B 9/06 | (2006.01) | |

(52) U.S. Cl.
CPC .............. *C25B 9/066* (2013.01); *C25B 9/08* (2013.01); *C25B 11/0405* (2013.01); *C25B 11/0447* (2013.01); *C25B 11/0452* (2013.01); *C25B 11/0473* (2013.01); *C25B 11/0478* (2013.01); *C25D 5/54* (2013.01); *C25D 7/12* (2013.01); *C25D 9/04* (2013.01); *B82Y 40/00* (2013.01); *C25D 5/022* (2013.01); *C25D 7/126* (2013.01); *C25D 9/08* (2013.01); *C25D 9/10* (2013.01); *C25D 11/022* (2013.01); *C25D 11/10* (2013.01); *H01L 2251/308* (2013.01); *Y02E 10/542* (2013.01); *Y02E 60/366* (2013.01); *Y02P 20/135* (2015.11); *Y02P 70/521* (2015.11)

(58) Field of Classification Search
CPC ............. C25B 11/0447; C25B 11/0452; C25B 11/0473; C25B 11/0478; C25D 5/54; C25D 7/12; C25D 9/04; C25D 5/022; C25D 9/08; C25D 9/10; C25D 11/10; C25D 11/022; C25D 7/126; H01G 9/2027; H01L 2251/308; Y02P 70/521; Y02P 20/135; Y02E 10/542; Y02E 60/366; B82Y 40/00

See application file for complete search history.

(56) References Cited

U.S. PATENT DOCUMENTS

| | | |
|---|---|---|
| 7,122,873 B2 | 10/2006 | Miller et al. |
| 2006/0151803 A1 | 7/2006 | Wesner et al. |
| 2010/0252441 A1 | 10/2010 | Chidsey et al. |

FOREIGN PATENT DOCUMENTS

| | | |
|---|---|---|
| JP | 2000-58885 A | 2/2000 |
| JP | 2003-288955 A | 10/2003 |
| JP | 2005-532472 | 10/2005 |
| JP | 4510015 | 7/2010 |
| JP | 2012-107278 | 6/2012 |
| JP | 2014-101550 | 6/2014 |
| JP | 2014-101551 | 6/2014 |
| JP | 2014-189882 | 10/2014 |
| JP | 2014-189883 | 10/2014 |
| TW | 201433358 | 9/2014 |
| TW | 201435148 | 9/2014 |
| WO | WO 2004/005585 A1 | 1/2004 |
| WO | WO 2014/080773 A1 | 5/2014 |
| WO | WO 2014/080774 A1 | 5/2014 |
| WO | WO 2014/156898 A1 | 10/2014 |
| WO | WO 2014/156899 A1 | 10/2014 |

OTHER PUBLICATIONS

Yi Wei Chen et al. "Atomic Layer-Deposited tunnel oxide stabilizes silicon photoanodes for water oxidation", Nature Materials, 2011, 21 pages ( with Supplementary Information).
Notification of Reasons for Refusal dated Jun. 27, 2017 in Japanese Patent Application No. 2016-509971 (with English language machine translation).
International Search Report dated Jun. 9, 2015 in PCT/JP2015/001215, filed on Mar. 6, 2015 ( with English translation).
Written Opinion dated Jun. 9, 2015 in PCT/JP2015/001215, filed on Mar. 6, 2015.
G.H Lin et al. "One Step method to produce hydrogen by a triple stack amorphous silicon solar cell", Applied Physics Letters, vol. 55, 1989, 3 pages.
Steven Y. Reece, et al, "Wireless Solar Water Splitting Using Silicon-Based Semiconductors and Earth-Abundant Catalysts", Science, vol. 334, 2011, 5 pgs.
International Preliminary Report on Patentability and Written Opinion dated Oct. 6, 2016 in PCT/JP2015/001215 (submitting English translation only).

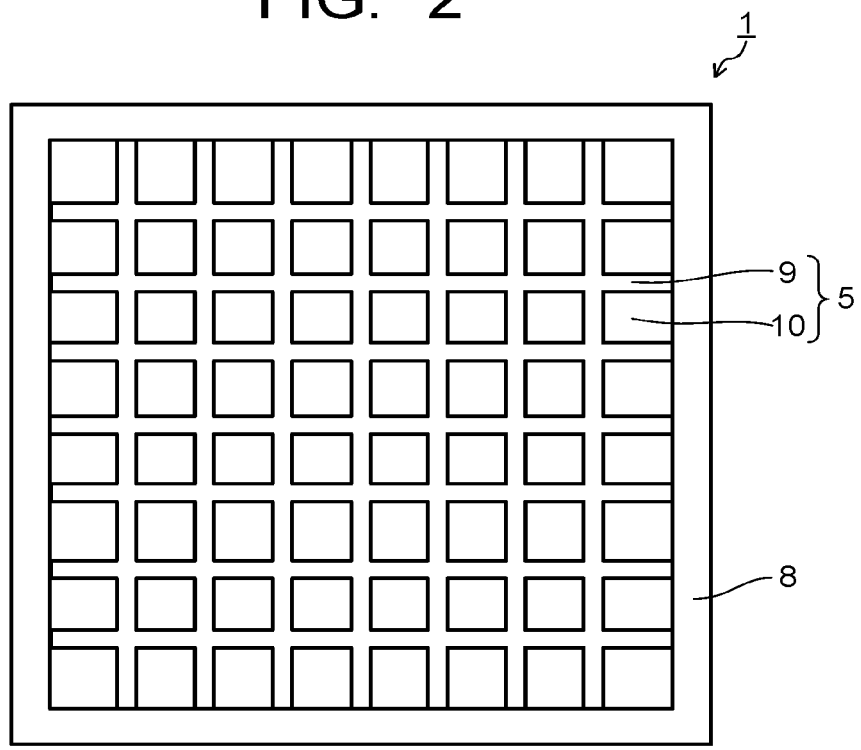

US 10,062,520 B2

PHOTO-ELECTROCHEMICAL CELL, MANUFACTURING METHOD OF PHOTO-ELECTROCHEMICAL CELL, AND PHOTO-ELECTROCHEMICAL REACTION DEVICE

CROSS-REFERENCE TO RELATED APPLICATIONS

This application is a continuation of prior International Application No. PCT/JP2015/001215 filed on Mar. 6, 2015, which is based upon and claims the benefit of priority from Japanese Patent Applications No. 2014-059594 filed on Mar. 24, 2014 and No. 2014-103188 filed on May 19, 2014; the entire contents of all of which are incorporated herein by reference.

FIELD

Embodiments described herein relate generally to a photo-electrochemical cell, a manufacturing method thereof, and a photo-electrochemical reaction device using the same.

BACKGROUND

In a view point of an energy problem and an environmental problem, attention is given to an artificial photosynthesis technology which artificially produces a storable chemical energy source from solar energy by imitating photosynthesis of plants. In the artificial photosynthesis technology, it is studied to use a photo-electrochemical cell which has a photoelectric conversion layer using a semiconductor, an oxidation catalyst layer, and a reduction catalyst layer. According the photo-electrochemical cell, a high efficiency is obtained by using a semiconductor layer excellent in light absorption and charge separation. A photo-electrochemical cell of a monolithic structure in which an oxidation catalyst layer and a reduction catalyst layer are disposed on both sides of a photoelectric conversion layer, since having a structure that does not require wiring, has characteristics that efficiency decrease due to wiring resistance does not occur, that size increase is easy, and that a manufacturing cost is low.

Since a photo-electrochemical cell which has a photoelectric conversion layer using a semiconductor is used while being immersed in an electrolytic solution, there is a possibility that a semiconductor layer is corroded by the electrolytic solution. For example, a catalyst layer formed on a light receiving surface side of the photoelectric conversion layer is formed into an island shape or a thin film shape in consideration of a light transmission property. In a photo-electrochemical cell having an island-shaped catalyst layer, though an incident light amount to a photoelectric conversion layer is large, a durability is decreased due to an existence of an exposed surface. In a photo-electrochemical cell having a thin film-shaped catalyst layer, a durability is high since an exposed surface does not exist, but on the other hand, an efficiency is decreased due to occurrence of an optical loss in the catalyst layer. In a conventional cell structure, an efficiency and a durability are in a relation of trade-off.

With regard to a conventional photo-electrochemical cell, as a measure to improve a durability (corrosion resistance), it is studied to prevent direct contact of a semiconductor layer to an electrolytic solution by forming a transparent conductive film which has corrosion resistance on a photo-electric conversion layer, or by forming a photocatalyst layer made of a titanium oxide, a tungsten oxide, or the like. However, in the former measure to improve a durability, since the catalyst layer is provided in a side surface portion of the cell, an electron and a positive hole generated in the photoelectric conversion layer receive a resistance loss of the transparent conductive film. Therefore, decrease in efficiency is incurred as a cell size becomes larger. In the latter measure to improve a durability, because of an equivalent circuit in which the photoelectric conversion layer and the photocatalyst layer are connected in series, an efficiency which is able to be obtained is limited by a capability of a photocatalyst.

BRIEF DESCRIPTION OF THE DRAWINGS

FIG. 2 is a plan view showing another disposition example of catalyst parts in the photo-electrochemical cell shown in FIG. 1.

DETAILED DESCRIPTION

According to one embodiment, there is provided a photo-electrochemical cell including: a photoelectric conversion layer having a first surface and a second surface; a first electrode provided on the first surface of the photoelectric conversion layer; a first catalyst layer including a plurality of catalyst parts disposed on the first electrode and a transparent dielectric part disposed in a gap between the plurality of catalyst parts; a second electrode provided on the second surface of the photoelectric conversion layer; and a second catalyst layer electrically connected to the second electrode.

According to another embodiment, there is provided a photo-electrochemical reaction device including: an electrolytic bath in which an electrolytic solution is accommodated; and the photo-electrochemical cell of the embodiment which is disposed in the electrolytic bath and immersed in the electrolytic solution.

Hereinafter, a photo-electrochemical cell of an embodiment and a photo-electrochemical reaction device using the same will be described with reference to the drawings.

(Photo-electrochemical Cell)

Figure 1A:
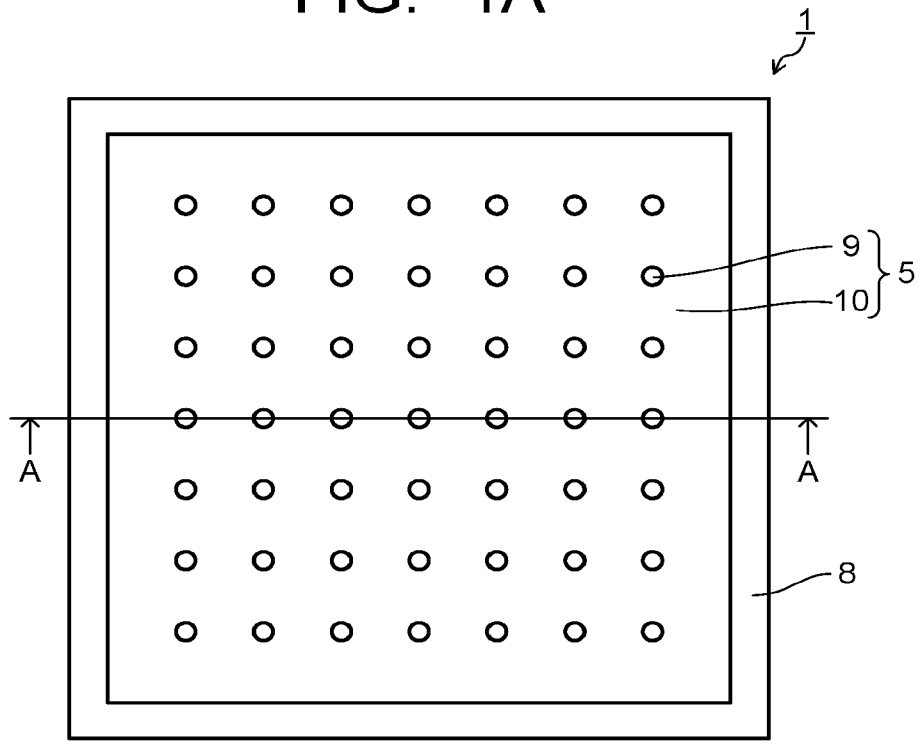
FIG. 1A is a plan view showing a first example of a photo-electrochemical cell according to an embodiment.
Figure 1B:
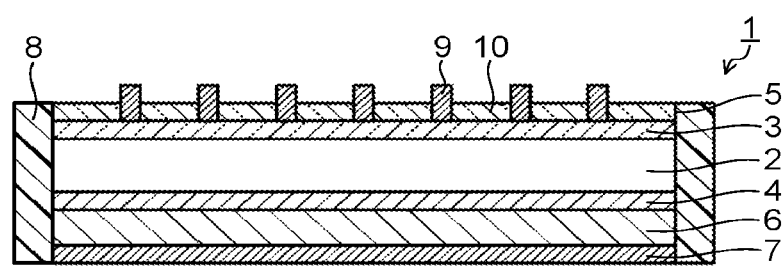
FIG. 1B is a cross-sectional view showing the first example of the photo-electrochemical cell according to the embodiment.

FIGS. 1A and 1B are views showing a first example of a photo-electrochemical cell according to an embodiment. FIG. 1A is a plan view of the photo-electrochemical cell, and FIG. 1B is a cross-sectional view taken along an A-A line of FIG. 1A. The photo-electrochemical cell 1 shown in FIGS. 1A and 1B has a photoelectric conversion layer 2, a first electrode 3 provided on a first surface of the photoelectric conversion layer 2, and a second electrode 4 provided on a second surface of the photoelectric conversion layer 2. A first catalyst layer 5 is provided on the first electrode 3. A second catalyst layer 7 is provided on the second electrode 4 via a conductive base material 6. A side surface of the photo-electrochemical cell 1 is covered by an insulating layer 8 in order to prevent erosion of the photoelectric conversion layer 2 by a leak current and an electrolytic solution. The first and second electrodes 3, 4 form ohmic contact to the photoelectric conversion layer 2, and the first electrode 3 to the second electrode 4 are connected in series. Here, a case where the first surface (formation surface of the first electrode 3) of the photoelectric conversion layer 2 is a light receiving surface will be described.

The photoelectric conversion layer 2 is a layer in which charge separation occurs inside the layer when light is irradiated, and thereby an electromotive force is generated. As the photoelectric conversion layer 2, there is exemplified a solar battery in which a pin junction type semiconductor or a pn junction type semiconductor is used. A solar battery other than the above may be applied as the photoelectric conversion layer 2. To a semiconductor layer constituting the photoelectric conversion layer 2, it is possible to apply a semiconductor of Si, Ge, Si—Ge, or the like, a compound semiconductor of GaAs, GaInP, AlGaInP, CdTe, CuInGaSe, or the like. The semiconductor layer is formed of a semiconductor of various conformations such as monocrystalline, polycrystalline, and amorphous. The photoelectric conversion layer 2 is preferable to be a multi junction photoelectric conversion layer in which two or more photoelectric conversion layers (solar batteries) are stacked in order to obtain a high open-circuit voltage.

It is preferable to apply a conductive film having a light transmission property to the first electrode 3 formed on the light receiving surface (first surface) of the photoelectric conversion layer 2. As such a conductive film, there can be cited a metal such as Ag, Au, Al, Cu, Ti, W, Cr, and Ni, an alloy which includes at least one of the above metals, or a transparent conductive oxide such as ITO (indium tin oxide), zinc oxide (ZnO), FTO (fluorine-doped tin oxide), AZO (aluminum-doped zinc oxide), and ATO (antimony-doped tin oxide). The first electrode 3 may have a structure in which a metal and a transparent conductive oxide are stacked, a structure in which a metal and another conductive material are compounded, a structure in which a transparent conductive oxide and another conductive material are compounded, for example, or the like. For example, the first electrode 3 may be applied a composite structure in which a conductive material such as graphene and silver nanowire is combined with a transparent nonconductive material such as a resin.

The second electrode 4 formed on the surface (second surface) on an opposite side to the light receiving surface of the photoelectric conversion layer 2 is formed of a metal such as Ag, Au, Al, Cu, Ti, W, Cr, and Ni, an alloy which includes at least one of the above metals, or a transparent conductive oxide such as ITO (indium tin oxide), zinc oxide (ZnO), FTO (fluorine-doped tin oxide), AZO (aluminum-doped zinc oxide), and ATO (antimony-doped tin oxide). The second electrode 4 is formed on the conductive base material 6 as necessary. The photo-electrochemical cell 1 is constituted, with the second electrode 4 or the conductive base material 6 being a substrate, by forming thereon the photoelectric conversion layer 2, the first electrode 3, the first catalyst layer 5, and so on, for example. By applying such a structure, mechanical strength of the photo-electrochemical cell 1 can be maintained. The second electrode 4 may also have a function of a support substrate, and in such a case, a metal plate, an alloy plate, a semiconductor substrate, or the like is used. The first and second electrodes 3, 4 are preferable to be formed of a material capable of ohmic contact to an n-type semiconductor or a p-type semiconductor which constitutes the photoelectric conversion layer 2.

A reflection layer which returns light that has not been absorbed by the photoelectric conversion layer 2 to the photoelectric conversion layer 2 again may be provided between the photoelectric conversion layer 2 and the second electrode 4. As a result of reusing the light that has not been absorbed by the photoelectric conversion layer 2 by using the reflection layer, an efficiency of a photo-electrochemical reaction can be heightened. The light reflection layer is disposed between arbitrary layers between the second surface of the photoelectric conversion layer 2 and the second catalyst layer 7. As the light reflection layer, it is possible to use a metal layer with a high light reflectivity, a reflection layer of a Bragg reflection type in which a plurality of dielectrics with different refractive indices are periodically stacked, or the like, for example.

The first and second catalyst layers 5, 7 are provided to decrease activation energy of a chemical reaction and to accelerate an oxidation-reduction reaction. By using an acceleration effect of the oxidation-reduction reaction by the first and second catalyst layers 5, 7, an overvoltage of the oxidation-reduction reaction can be decreased. Therefore, the electromotive force generated in the photoelectric conversion layer 2 can be used more effectively. Since the oxidation-reduction reaction is generated as an overall reaction in the photo-electrochemical cell 1, the second catalyst layer 7 is a reduction catalyst in a case where the first catalyst layer 5 is an oxidation catalyst. If the first catalyst layer 5 is a reduction catalyst, the second catalyst layer 7 is an oxidation catalyst. The oxidation catalyst receives a positive hole and the reduction catalyst receives an electron. Thus, the oxidation catalyst is disposed on a p-type semiconductor layer side of the photoelectric conversion layer 2 and the reduction catalyst is disposed on an n-type semiconductor layer side of the photoelectric conversion layer 2.

The oxidation catalyst is constituted with a material which exhibits activity to an oxidation reaction of water ($H_2O$) and decreases activation energy for oxidizing $H_2O$. In other words, the oxidation catalyst is constituted with the material which lowers an overvoltage at a time that $H_2O$ is oxidized to produce $O_2$ and $H^+$. As such a material, there can be cited a metal such as Ir, Ru, Co, Mn, Ni, and Fe, an oxide of such a metal, or a metal complex. The metal oxide is not limited to a binary metal oxide such as manganese oxide (Mn—O) and iridium oxide (Ir—O), but may be a ternary metal oxide such as Ni—Co—O and Ni—Fe—O, or a quaternary metal oxide such as Pb—Ru—Ir—O and La—Sr—Co—O. It is possible to use a carbon material such as carbon black, activated carbon, fullerene, carbon nanotube, graphene, ketjen black, and diamond, as the oxidation catalyst.

The reduction catalyst is constituted with a material which exhibits activity to a reduction reaction of carbon dioxide ($CO_2$) or water ($H_2O$) and decreases activation energy for reducing $CO_2$ or $H_2O$. In other words, the reduction catalyst is constituted with the material which lowers an overvoltage at a time that $CO_2$ or $H_2O$ is reduced to produce a carbon compound, hydrogen, or the like. As the reduction catalyst of $CO_2$, there can be cited a metal such as Au, Ag, Cu, Zn, In, Sn, Cd, Pb, and Re, or an alloy which includes at least one of such metals, a metal complex, or the like. As the reduction catalyst of $H_2O$, there can be cited a metal such as Pt, Ru, Mo, Pd, Ni, and Fe, an alloy which includes at least one of such metals, a metal complex, or the like. It is possible to use the carbon material such as carbon black, activated carbon, fullerene, carbon nanotube, graphene, ketjen black, and diamond, as the reduction catalyst. A mode of the catalyst layer is not limited to a film shape but may be a particulate shape, or the catalyst may be supported by or compounded with a carbon material or a conductive particle.

The first catalyst layer 5 formed on the light receiving surface side of the photoelectric conversion layer 2 has a plurality of catalyst parts 9 disposed on the first electrode 3 made of the conductive film having the light transmission property, and a transparent dielectric part 10 disposed in a gap between the plurality of catalyst parts 9. The plurality of catalyst parts 9 are formed of the aforementioned oxidation catalyst or reduction catalyst. The transparent dielectric part 10 is formed of a material which has a transmission property of light and a corrosion resistance to an electrolytic solution. As such a material, there can be cited a resin material such as epoxy resin, fluorocarbon resin, or cycloolefin resin, an inorganic compound material such as a metal oxide, a metal nitride, and a metal oxynitride compound which includes a metal of Ti, Zr, Al, Si, Hf, or the like, or a glass material whose main component is silica, boric acid, phosphoric acid, for example.

As a planar shape of the plurality of catalyst parts 9, a dotted pattern shown in FIG. 1A and a linear pattern shown in FIG. 2 are exemplified. The shape of the plurality of catalyst parts 9 is not limited thereto but it suffices if the shape has a pattern having a gap (space) as a light transmitting part among the catalyst parts 9. In the gap among the plurality of catalyst parts 9 is disposed the transparent dielectric part 10 which is made of a dielectric that has a transmission property of light and has a corrosion resistance to an electrolytic solution. According to the first catalyst layer 5 which has the plurality of catalyst parts 9 and the transparent dielectric part 10, it becomes possible to prevent corrosion of the photoelectric conversion layer (semiconductor layer or the like) 2 by an electrolytic solution while securing a light irradiation amount to the photoelectric conversion layer 2 sufficiently. It is possible to irradiate light sufficiently from the transparent dielectric part 10 to the photoelectric conversion layer 2. Further, since the transparent dielectric part 10 has the corrosion resistance, corrosion or the like of the photoelectric conversion layer 2 can be prevented.

An individual shape of the plurality of catalyst parts 9 is not limited to a circular shape shown in FIG. 1A, but may be an elliptical shape, a rectangular shape, a triangular shape, or the like. The plurality of catalyst parts 9 may be disposed methodically as in a rectangular lattice shape, a triangular lattice shape, a circular shape, or the like, or may be disposed randomly. With regard to the plurality of catalyst parts 9, a linear pattern may be disposed in a lattice shape as shown in FIG. 2. Disposition of the linear pattern may be in a comb shape, a circular shape, a spiral shape, or the like. When an interval among the plurality of catalyst parts 9 is too large, a migration distance of a carrier (an electron or a positive hole) generated in the photoelectric conversion layer 2 becomes long, and there is a possibility that deterioration of an efficiency is incurred by a resistance loss. An average distance among the plurality of catalyst parts 9 is preferable, for example, to be 2 mm or less, and is more preferable to be 100 μm or less. A lower limit of the average distance among the plurality of catalyst parts 9 is not limited in particular, but is preferable to be 10 nm or more so that a gap can be obtained stably.

Light irradiated to the photo-electrochemical cell 1 passes through a composite surface which has the plurality of catalyst parts 9 and the transparent dielectric part 10 and reaches the photoelectric conversion layer 2. The composite surface of the first catalyst layer 5 has a light transmission property to irradiated light. The first catalyst layer 5 which has the plurality of catalyst parts 9 and the transparent dielectric part 10 is preferable to transmit 50% or more of an irradiated light amount, and is more preferable to transmit 70% or more thereof. An abundance ratio of the catalyst parts 9 and the transparent dielectric part 10 in the first catalyst layer 5 is preferable to be set so that a transmittance of irradiated light by the first catalyst layer 5 may be in the above-described range.

Thicknesses of the plurality of catalyst parts 9 and the transparent dielectric part 10 may be the same or one of the thicknesses may be larger. As shown in FIG. 1B, the catalyst part 9 may be protruded and the transparent dielectric part 10 may be recessed, and vice versa. As the thickness of the plurality of catalyst parts 9 increases, a reaction surface is increased and activity is improved. On the other hand, when the thickness of the catalyst part 9 is too small, there is a possibility that a foundation layer cannot be covered sufficiently, which causes erosion of the electrolytic solution. Therefore, the thickness of the catalyst part 9 is preferable to be 10 nm or more to 100 μm or less, and is more preferable to be 100 nm or more to 10 μm or less.

The transparent dielectric part 10 is preferable to have a stable thickness to the electrolytic solution in a long term. The thickness of the transparent dielectric part 10 is preferable to be 10 nm or more to 1 mm or less, and is more preferable to be 1 μm or more to 100 μm or less. When the thickness of the transparent dielectric part 10 is 1 μm or less, by making the thickness be m/(4n) times ("m" is an integer (1, 2, 3), "n" is a refractive index of a transparent dielectric) as large as a wavelength of irradiated light, an antireflection effect can be obtained. Therefore, it is possible to make light be incident into the photoelectric conversion layer 2 efficiently. When light having wavelength dispersion such as sunlight is made to be incident, a film thickness may be designed so that an antireflection effect can be obtained to light of a highest wavelength range of an irradiation intensity of a wavelength of 550 nm, for example.

The surface (composite surface) of the first catalyst layer 5 which has the plurality of catalyst parts 9 and the transparent dielectric part 10 is preferable to have wettability to the electrolytic solution. With regard to the wettability of the first catalyst layer 5, a static contact angle to the electrolytic solution of the composite surface constituted by the catalyst part 5 and the transparent dielectric part 10 is preferable to be less than 90 degrees in measurement by a contact angle meter, and further, is more preferable to be 60 degrees or less. As a result that the surface of the first catalyst layer 5 has wettability to the electrolytic solution, a product (gas, in particular) generated in the first catalyst layer 5 can be separated effectively, and a highly efficient photo-electrochemical cell 1 can be obtained.

As a forming method of the first catalyst layer 5 which has the plurality of catalyst parts 9 and the transparent dielectric part 10, there can be cited a method of forming a mask pattern which has openings on the first electrode 3, forming a catalyst layer in the opening, removing the mask pattern to form a plurality of catalyst parts 9, forming a transparent dielectric layer on the first electrode 3 in a manner that the catalyst part 9 is buried, and etching the transparent dielectric layer to form a transparent dielectric part 10 with a predetermined thickens. It is possible to form a transparent dielectric layer which has openings on the first electrode 3 and to form catalyst parts 9 by burying a catalyst material in the opening. As a forming method of the mask pattern, there can be cited a method of forming by common optical lithography or electron-beam lithography, a method using imprinting, a printing method by inkjet or screen printing, a mask forming method using a block copolymer or a self-assembled pattern of particles, a method using a hole pattern obtained by anodically oxidizing aluminum, or the like.

Figure 3:
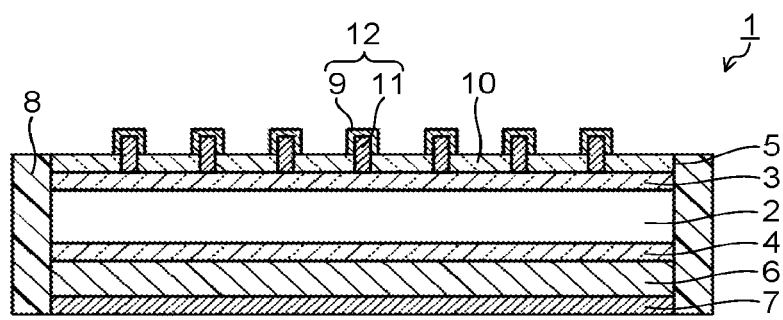
FIG. 3 is a cross-sectional view showing a second example of the photo-electrochemical cell according to the embodiment.

A second example of the photo-electrochemical cell 1 according to the embodiment will be described with reference to FIG. 3 to FIG. 5. A plurality of catalyst parts 9 in a first catalyst layer 5 may be formed along surfaces of a plurality of conductive parts 11 disposed on a first electrode 3 made of a transparent conductive film or the like, as shown in FIG. 3. The first catalyst layer 5 shown in FIG. 3 has composite structure parts 12 of the conductive parts 11 and the catalyst parts 9, and a transparent dielectric part 10 disposed in a gap of the composite structure parts 12. In the photo-electrochemical cell 1, in order to heighten catalyst activity by making a specific surface area of the catalyst layer large, it is effective to make the catalyst parts 9 protruded and make the transparent dielectric part 10 recessed. Thus, a height of the composite structure part 12 of the conductive part 11 and the catalyst part 9 is preferable to be larger than that of the transparent dielectric part 10.

In the shape shown in FIG. 1B, when a height is increased in order to make a specific surface area of the catalyst part 9 large, a loss (resistance loss) of carrier migration occurs inside the catalyst part 9. As a result, activity of the catalyst part 9 does not change very much even if the catalyst part 9 is made higher than a certain height. In view of such a point, by forming the catalyst part 9 along the surface of the conductive part 11, a loss (carrier loss) of an electron or a positive hole carried from the photoelectric conversion layer 2 is suppressed. Since an improvement effect of the catalyst activity by increase of the specific surface area of the catalyst part 9 is heightened, the efficiency of the photo-electrochemical cell 1 can be improved more effectively. Further, by providing the conductive part 11 as a foundation of the catalyst part 9, erosion of the electrolytic solution from the catalyst part 9 is suppressed. A durability of the photo-electrochemical cell 1 is also improved. The catalyst part 9 is not necessarily required to be protruded and the transparent dielectric part 10 is not necessarily required to be recessed as in a structure of FIG. 3, and a durability can be improved by making a catalyst part 9 recessed and making a transparent dielectric part 10 protruded.

As a forming material of the conductive part 11, there can be cited a metal such as Cu, Al, Ti, Ni, Ag, W, Co, and Au, an alloy which includes at least one of the above metals, a stacked film of such metals, a transparent conductive oxide such as ITO, ZnO, FTO, AZO, and ATO, or a carbon material such as carbon black, activated carbon, fullerene, carbon nanotube, graphene, ketjen black, and diamond, for example. The forming materials of the catalyst part 9 and the transparent dielectric part 10 are as described above.

The composite structure part 12 of the conductive part 11 and the catalyst part 9 has a circular shape, an elliptical shape, a rectangular shape, a triangular shape or the like in planar shape, similarly to the catalyst part 9 shown in FIG. 1A. The plurality of composite structure parts 12 may be disposed methodically as in a rectangular lattice shape, a triangular lattice shape, a circular shape, or the like, or may be disposed randomly. The plurality of composite structure parts 12 may have a linear pattern of a lattice shape as shown in FIG. 2, and may have a linear pattern of a comb shape, a circular shape, a spiral shape, or the like. An interval of the plurality of composite structure parts 12, a thickness of the first catalyst layer 5, and so on are as described above. The thickness of the first catalyst layer 5 and a light transmission property based on a ratio or the like of the composite structure parts 12 and the transparent dielectric part 10 are also as described above.

Figure 4:
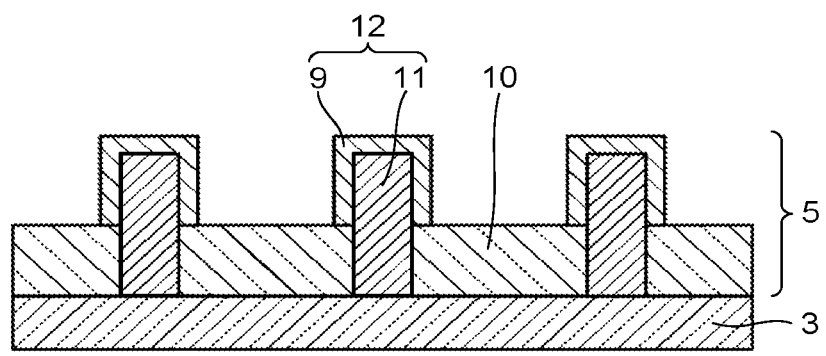
FIG. 4 is a cross-sectional view enlargedly showing a part of the photo-electrochemical cell shown in FIG. 3.
Figure 5:
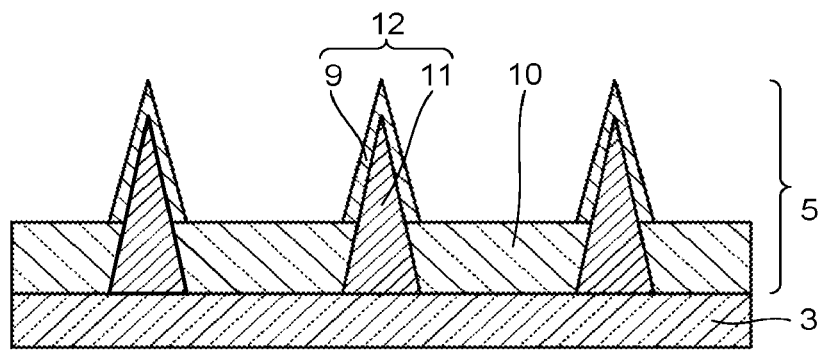
FIG. 5 is a cross-sectional view enlargedly showing a part of a modified example of the photo-electrochemical cell shown in FIG. 3.

The conductive part 11 has a cross-sectional shape of a rectangular shape enlargedly shown in FIG. 4 or a tapered shape enlargedly shown in FIG. 5. The conductive part 11 shown in FIG. 4 has an entire shape of a cylinder, a square pole, polygonal pole, or the like. The conductive part 11 shown in FIG. 5 has an entire shape of a cone, a triangular pyramid, a quadrangular pyramid, a polygonal pyramid, or the like. As shown in FIG. 5, by making a side surface of the composite structure part 12 of the conductive part 11 and the catalyst part 9 be of the tapered shape, incident light to the composite structure part 12 becomes easy to be reflected on a tapered surface and introduced to the transparent dielectric part 10. Since a light amount incident to the photoelectric conversion layer 2 is increased and a use efficiency of light becomes high, the efficiency of the photo-electrochemical cell 1 can be improved. In this case, the catalyst part 9 is preferable to have a light transmission property. A thickness of the catalyst part 9 is preferable to be 1 nm or more to 100 nm or less.

Figure 6:
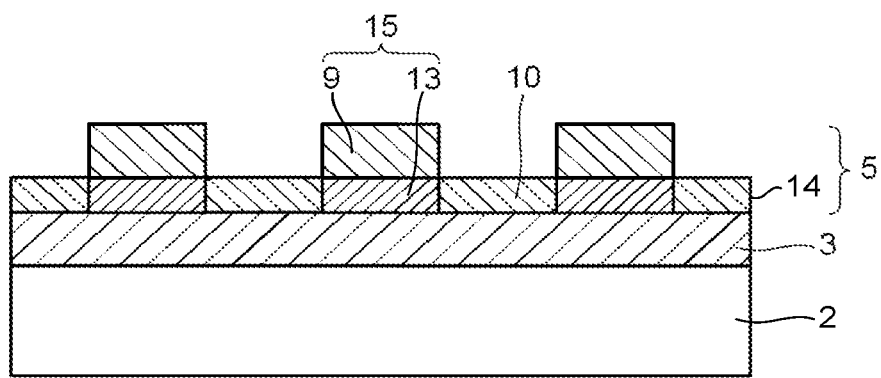
FIG. 6 is a cross-sectional view showing a third example of the photo-electrochemical cell according to the embodiment.

A third example of the photo-electrochemical cell 1 according to the embodiment will be described with reference to FIG. 6. A first catalyst layer 5 may have a composite layer 14 which has a conductive part 13 and a transparent dielectric part 10, and a catalyst part 9 formed on the conductive part 13 in the composite layer 14, as shown in FIG. 6. The conductive part 13 and the transparent dielectric part 10 coexist in a plane. The first catalyst layer 5 shown in FIG. 6 has a stacked part 15 of the conductive part 13 and the catalyst part 9, and the transparent dielectric part 10 disposed in a gap among the stacked parts 15. In this case, the conductive part 13 can be also used as a first electrode 3. In other words, though a structure in which the conductive part 13 is formed on a first electrode 3 is shown in FIG. 6, the conductive part 13 may be formed on a photoelectric conversion layer 2 as a first electrode.

The conductive part 13 is made of a metal, an alloy, or a conductive compound which includes a metal. As the conductive compound constituting the conductive part 13, a nitride of a metal is exemplified. The conductive part 13 may be a single layer film of a metal, an alloy, or a conductive compound and may be a stacked film thereof. By providing the conductive part 13 between the catalyst part 9 and the first electrode 3, a carrier generated in the photoelectric conversion layer 2 can be collected efficiently and supplied to the catalyst part 9, and further, erosion of an electrolytic solution from the catalyst part 9 can be suppressed. When the conductive part 13 is provided between the catalyst part 9 and the photoelectric conversion layer 2, the carrier generated in the photoelectric conversion layer 2 can be collected in the conductive part 13 and supplied to the catalyst part 9.

When the conductive part 13 made of the metal, the alloy, or the conductive compound which includes the metal is applied, it is preferable to use, for the transparent dielectric part 10, an insulating compound such as an oxide of the metal constituting the conductive part 13 or the metal included in the alloy or conductive compound constituting the conductive part 13. As will be described in detail later, by using a part of a conductive film made of a metal layer, an alloy layer, or a conductive compound layer formed evenly on the first electrode 3 as the conductive part 13 and oxidizing a part other than the part used as the conductive part 13 of the conductive film partially for example, it is possible to form the transparent dielectric part 10 constituted with the insulating compound such as a metal oxide among the plurality of conductive parts 13. Thereby, it is possible to obtain the first catalyst layer 5 in which the transparent dielectric part 10 is disposed in the gap among the stacked parts 15 of the plurality of conductive parts 13 and catalyst parts 9 simply and at a low cost.

In forming the transparent dielectric part 10 by partially oxidizing the conductive film, it is preferable that the metal, the alloy, or the conductive compound which constitutes the conductive part 13 includes a metal element (valve metal) which is easy to come into a passive state as a result of a comparatively thick oxide coating film (of several nm or more) being formed by anodic oxidation, for example. As such a metal element, there can be cited Al, Nb, Ti, Zr, Hf, Si, Bi, W, V, Th, Be, Ca, Mn, or the like. The conductive part 13 is preferable to be formed of a single layer of the above-described metal element, an alloy layer which includes at least one of the above-described metal elements, a conductive compound layer such as a nitride of the above-described metal element, or a stacked film thereof. The conductive part 13 is preferable to have a resistivity of $1\times10^{-7}$ Ω·cm or more to $1\times10^{-1}$ Ω·cm or less. When the conductive part 13 is to be made of a metal nitride or the like, the metal nitride may include oxygen or the like as an impurity as long as the conductive part 13 has such a resistivity.

In the photo-electrochemical cell 1 shown in FIG. 6, the transparent dielectric part 10 is preferable to be made of a metal oxide layer. A metal oxide is a dielectric which has a light transmission property in general and has a small conductivity. Therefore, the metal oxide layer is suitable as the transparent dielectric part 10 which prevents corrosion of the photoelectric conversion layer 2 by the electrolytic solution while maintaining irradiation of light to the photoelectric conversion layer 2. The transparent dielectric part 10 is preferable to be made of a metal oxide which includes at least one of the above-described metal elements (valve metals). Many of the above-described metal elements (valve metals) are classified into a first group to a sixth group and thirteenth group to a fifteenth group of a periodic table where an ionic bonding property to an oxygen atom is strong.

The transparent dielectric part 10 made of the oxide layer of the metal element as described above is preferable to have a stable thickness to the electrolytic solution for a long term. However, when the thickness of the metal oxide layer is too large, a crack or the like is easy to occur and there is a possibility that the electrolytic solution erodes therefrom. Therefore, the thickness of the metal oxide layer (10) is preferable to be 10 nm or more to 1 μm or less, and is more preferable to be 10 nm or more to 500 nm or less. If the transparent dielectric part 10 is formed by partially oxidizing the conductive film, the thickness of the transparent dielectric part 10 is the same as a thickness of the conductive part 13 in effect. However, there is a case where a part of an oxide coating film elutes in a step of partially oxidizing the conductive film. Therefore, there is also a case where the thickness of the transparent dielectric part 10 is smaller than the thickness of the conductive part 13.

The stacked part 15 of the conductive part 13 and the catalyst part 9 has a circular shape, an elliptical shape, a rectangular shape, a triangular shape or the like in planar shape, similarly to the catalyst part 9 shown in FIG. 1A. The plurality of stacked parts 15 may be disposed methodically as in a rectangular lattice shape, a triangular lattice shape, a circular shape, or the like, or may be disposed randomly. The plurality of stacked parts 15 may have a linear pattern of a lattice shape as shown in FIG. 2, and may have a linear pattern of a comb shape, a circular shape, a spiral shape, or the like. An interval of the plurality of stacked parts 15, a thickness of the catalyst layer 9, and so on are as described above. A thickness of the first catalyst layer 5 and a light transmission property based on a ratio or the like of the stacked parts 15 and the transparent dielectric part 10 are also as described above.

Figure 7A:
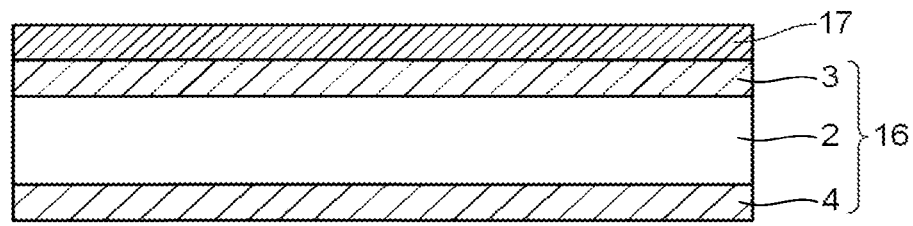
FIG. 7A is a cross-sectional view showing a manufacturing process of the photo-electrochemical cell shown in FIG. 6.
Figure 7B:
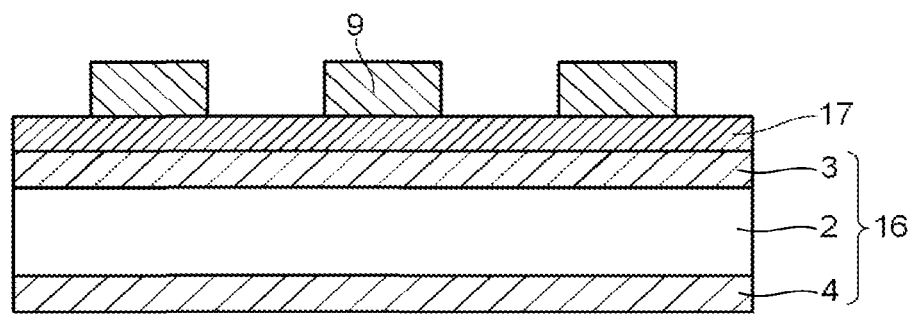
FIG. 7B is a cross-sectional view showing a manufacturing process of the photo-electrochemical cell shown in FIG. 6.
Figure 7C:
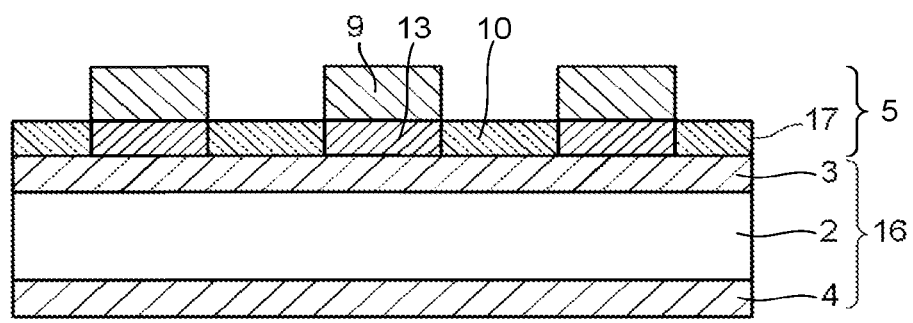
FIG. 7C is a cross-sectional view showing a manufacturing process of the photo-electrochemical cell shown in FIG. 6.

The first catalyst layer 5 shown in FIG. 6 is formed as follows, for example. A forming process of a first catalyst layer 5 will be described with reference to FIGS. 7. As shown in FIG. 7A, there is prepared a stacked body 16 which has a first electrode 3, a photoelectric conversion layer 2, and a second electrode 4 (or a stacked body of a photoelectric conversion layer 2 and a second electrode 4). A conductive film 17 made of a metal, an alloy, or a conductive compound such as a metal nitride is formed on the first electrode 3 (or on the photoelectric conversion layer 2). As shown in FIG. 7B, a plurality of catalyst parts 9 are formed to have a gap on the conductive film 17. As shown in FIG. 7C, with the plurality of catalyst parts 9 being masks, a portion exposed among the catalyst parts 9 of the conductive film 17 is selectively oxidized, to form a transparent dielectric part 10.

As a forming method of the plurality of catalyst parts 9, there can be cited a method in which a mask having a gap is formed, a catalyst part is buried in the gap, and the mask is removed (lift-off method), or a method in which a catalyst layer is formed and the catalyst layer is etched by using a mask to form a gap. As a forming method of a mask, there can be cited a method of forming by common optical lithography or electron-beam lithography, a method using imprinting, a printing method by inkjet or screen printing, a mask forming method using a block copolymer or a self-assembled pattern of particles, a method using a hole pattern obtained by anodically oxidizing aluminum, or the like. Catalyst parts 9 having a gap may be formed by dispersing particulate catalysts onto a substrate, other than by the forming method using the mask. By applying the forming process of the catalyst layer 5 shown in FIG. 7A to FIG. 7C, the catalyst layer 5 which has the catalyst parts 9 and the transparent dielectric part 10 can be formed simply and at a low cost.

To an oxidation method of the conductive film 17, thermal oxidation, anodic oxidation, an oxidation method using oxygen plasma, or the like can be applied. Among the above oxidation methods, anodic oxidation can form an oxide coating film higher in anisotropy than thermal oxidation. As a result of partially oxidizing the conductive film 17 by applying anodic oxidation, it is possible to suppress progress of oxidation to a lower portion of the stacked part 15 of the catalyst part 9 and the conductive part 13. Therefore, it becomes possible to partially form the transparent dielectric part 10 in the conductive film 17 while maintaining a function of the conductive part 13. When the oxide coating film (transparent dielectric part 10) is to be formed by anodic oxidation, it is preferable to use an electrolytic solution which is hard to dissolve the oxide coating film in carrying out anodic oxidation. A pH of the electrolytic solution is preferable to be 4 or more to 10 or less. By carrying out anodic oxidation by using such an electrolytic solution, a dense and thick oxide coating film can be formed.

(Photo-electrochemical Reaction Device)

Figure 8:
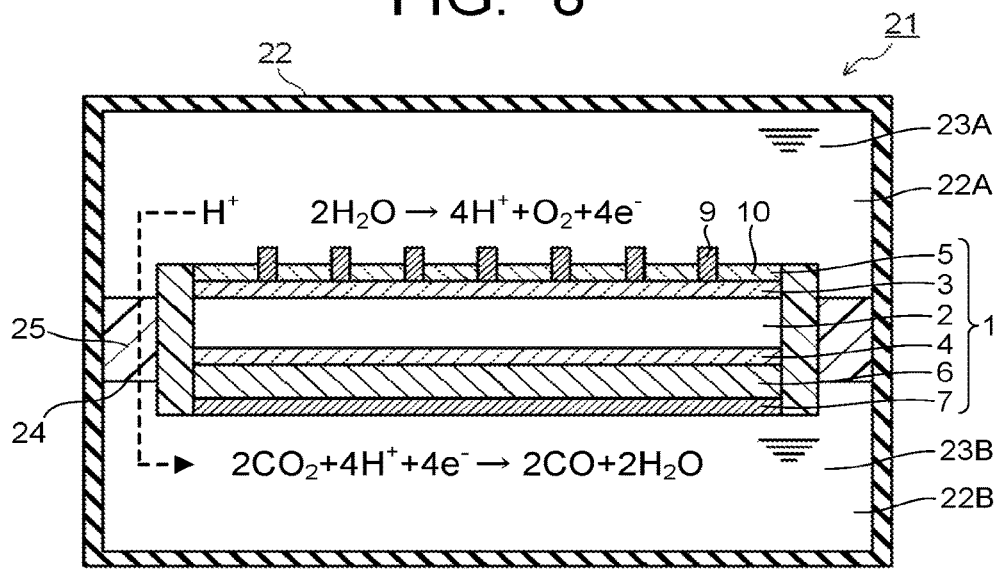
FIG. 8 is a diagram showing a first example of a photo-electrochemical reaction device using the photo-electrochemical cell of the embodiment.

Next, a photo-electrochemical reaction device of the embodiment will be described with reference to FIG. 8 and FIG. 9. FIG. 8 is a cross-sectional view showing a first example of the photo-electrochemical reaction device according to the embodiment. The photo-electrochemical reaction device 21 shown in FIG. 8 has an electrolytic bath 22 in which the photo-electrochemical cell 1 of the embodiment described above is disposed. The photo-electrochemical reaction device 21 has the electrolytic bath 22 in which an electrolytic solution 23 is accommodated and the photo-electrochemical cell 1 disposed in the electrolytic bath 22 and immersed in the electrolytic solution 23. The electrolytic bath 22 is separated into two chambers by the photo-electrochemical cell 1. The electrolytic bath 22 is separated into a first liquid chamber 22A in which a first electrolytic solution 23A is filled and where a first catalyst layer 5 is immersed in the first electrolytic solution 23A, and a second liquid chamber 22B in which a second electrolytic solution 23B is filled and where a second catalyst layer 7 is immersed in the second electrolytic solution 23B.

The first liquid chamber 22A and the second liquid chamber 22B are connected by an electrolytic solution flow path 24 provided in the electrolytic bath 22 as an ion migration path. An ion exchange membrane 25 is filled in the electrolytic solution flow path 24. By such an electrolytic flow path 24 which has the ion exchange membrane 25, a product generated in the first catalyst layer 5 and a product generated in the second catalyst layer 7 are separated, while only specific ions are let to pass. As the ion exchange membrane 25, there is used, for example, a cation exchange membrane such as Nafion or Flemion, or an anion exchange membrane such as Neosepta or Selemion. A glass filter, agar, or the like may be filled in the electrolytic flow path 24. The ion migration path is not limited to the electrolytic solution flow path 24 provided on a wall surface side in the electrolytic bath 22. The ion migration path may be constituted with a plurality of fine pores (through holes) provided in the photo-electrochemical cell 1.

As one of the first and second electrolytic solutions 23A, 23B, a solution which includes $H_2O$ is used, for example, and as the other thereof, a solution which includes $CO_2$ is used, for example. As the solution which includes $H_2O$, it is preferable to use an aqueous solution which includes an arbitrary electrolyte. This solution is preferable to be an aqueous solution to promote an oxidation reaction of $H_2O$. As the aqueous solution which includes the electrolyte, there can be cited an aqueous solution which includes a phosphoric acid ion ($PO_4^{2-}$), a boric acid ion ($BO_3^{3-}$), a sodium ion ($Na^+$), a potassium ion ($K^+$), a calcium ion ($Ca^{2+}$), a lithium ion ($Li^+$), a cesium ion ($Cs^+$), a magnesium ion ($Mg^{2+}$), a chloride ion ($Cl^-$), a hydrogen carbonate ion ($HCO_3^-$), or the like.

The solution which includes $CO_2$ is preferable to be a solution with a high $CO_2$ absorptance, and as the solution which includes $H_2O$, there can be cited an aqueous solution of $LiHCO_3$, $NaHCO_3$, $KHCO_3$, $CsHCO_3$, or the like. As the solution which includes $CO_2$, alcohols such as methanol, ethanol, and acetone may be used. The solution which includes $H_2O$ and the solution which includes $CO_2$ may be the same solutions. Since the solution which includes $CO_2$ is preferable to be high in $CO_2$ absorption amount, a solution different from the solution which includes $H_2O$ may be used. The solution which includes $CO_2$ is desired to be an electrolytic solution that lowers a reduction potential of $CO_2$, has a high ion conductivity, and includes a $CO_2$ absorbent that absorbs $CO_2$.

As the aforementioned electrolytic solution, there can be cited an ionic liquid which is made of salt of a cation such as imidazolium ion or pyridinium ion and an anion such as $BF_4^-$ or $PF_6^-$ and which is in a liquid state in a wide temperature range, or its aqueous solution. As another electrolytic solution, there can be cited an amine solution of ethanolamine, imidazole, or pyridine, or an aqueous solution thereof. Amine may be any of primary amine, secondary amine, and tertiary amine. As the primary amine, there can be cited methylamine, ethylamine, propylamine, butylamine, pentylamine, hexylamine, or the like. A hydrocarbon of the amine may be substituted by alcohol, halogen, or the like. As the amine whose hydrocarbon is substituted, there can be cited methanolamine, ethanolamine, chloromethyl amine, or the like. Further, an unsaturated bond may exist. These hydrocarbons are the same in the secondary amine and the tertiary amine. As the secondary amine, there can be cited dimethylamine, diethylamine, dipropylamine, dibutylamine, dipentylamine, dihexylamine, dimethanolamine, diethanolamine, dipropanolamine, or the like. The substituted hydrocarbon may be different. This also applies to the tertiary amine. For example, as one in which the hydrocarbon is different, there can be cited methylethylamine, methylpropylamine, or the like. As the tertiary amine, there can be cited trimethylamine, triethylamine, tripropylamine, tributylamine, trihexylamine, trimethanolamine, triethanolamine, tripropanolamine, tributanolamine, triexanolamine, methyldiethylamine, methyldipropylamine, or the like. As the cation of the ionic liquid, there can be cited 1-ethyl-3-methylimidazolium ion, 1-methyl-3-propylimidazolium ion, 1-butyl-3-methylimidazole ion, 1-methyl-3-pentylimidazolium ion, 1-hexyl-3-methylimidazolium ion, or the like. A second place of imidazolium ion may be substituted. As one in which the second place of the imidazolium ion is substituted, there can be cited 1-ethyl-2,3-dimethylimidazolium ion, 1,2-dimethyl-3-propylimidazolium ion, 1-butyl-2,3-dimethylimidazolium ion, 1,2-dimethyl-3-pentylimidazolium ions 1-hexyl-2,3-dimethylimidazolium ion, or the like. As the pyridinium ion, there can be cited methylpyridinium, ethylpyridinium, propylpyridinium, butylpyridinium, pentylpyridinium, hexylpyridinium, or the like. In both of the imidazolium ion and the pyridinium ion, an alkyl group may be substituted, or an unsaturated bond may exist. As the anion, there can be cited fluoride ion, chloride ion, bromide ion, iodide ion, $BF_4^-$, $PF_6^-$, $CF_3COO^-$, $CF_3SO_3^-$, $NO_3^-$, $SCN^-$, $(CF_3SO_2)_3C^-$, bis(trifluoromethoxysulfonyl)imide, bis(trifluoromethoxysulfonyl) imide, bis(perfluoroethylsulfonyl)imide, or the like. A dipolar ion in which the cation and the anion of the ionic liquid are coupled by a hydrocarbon may be used.

Operation and an oxidation reduction reaction of the photo-electrochemical reaction device 21 will be described. Here, a case will be described where the first catalyst layer 5 on a light irradiation side is an oxidation catalyst, the second catalyst layer 7 on an opposite side is a reduction catalyst, and an absorbing liquid which absorbs $CO_2$ is used as the second electrolytic solution 23B. Light irradiated from above the photo-electrochemical reaction device 21 (on a first catalyst layer 5 side) passes through the first catalyst layer 5 and the first electrode 3 and reaches the photoelectric conversion layer 2. The photoelectric conversion layer 2, when absorbing light, produces an electron and a positive hole to be a counterpart thereof, and separates the electron and the positive hole. In other words, in the photoelectric conversion layer 2, the electron migrates to an n-type semiconductor layer side (second electrode 4 side) by a built-in potential, and the positive hole generated as the counterpart of the electron migrates to a p-type semiconductor side (first electrode 3 side). By such charge separation, an electromotive force is generated in the photoelectric conversion layer 2.

The positive hole generated in the photoelectric conversion layer 2 migrates to the first electrode 3 and bonds with an electron generated by an oxidation reaction caused in a neighborhood of the first electrode 3 and the first catalyst layer 5. The electron generated in the photoelectric conversion layer 2 migrates to the second electrode 4 and is used for a reduction reaction cased in a neighborhood of the second electrode 4 and the second catalyst layer 7. Concretely, in the neighborhood of the first electrode 3 and the first catalyst layer 5 which are in contact with the first electrolytic solution 23A, a reaction of the following formula (1) occurs. In the neighborhood of the second electrode 4 and the second catalyst layer 7 which are in contact with the second electrolytic solution 23B, a reaction of the following formula (2) occurs.

$$2H_2O \rightarrow 4H^+ + O_2 + 4e^- \tag{1}$$

$$2CO_2 + 4H^+ + 4e^- \rightarrow 2CO + 2H_2O \tag{2}$$

In the neighborhood of the first electrode 3 and the first catalyst layer 5, $H_2O$ included in the first electrolytic solution 23A is oxidized (loses an electron), so that $O_2$ and $H^+$ are produced, as expressed by the formula (1). $H^+$ produced on the first electrode 3 side migrates to the second electrode 4 side via the electrolytic solution flow path 24 as the ion migration path, for example. In the neighborhood the second electrode 4 and the second catalyst layer 7, $CO_2$ in the second electrolytic solution 23B is reduced (obtains an electron) as expressed by the formula (2). Concretely, $CO_2$ in the second electrolytic solution 23B, $H^+$ which has migrated via the ion migration path, and the electron which has migrated to the second electrode 4 react with one another, so that CO and $H_2O$ are produced, for example.

The photoelectric conversion layer 2 needs to have an open-circuit voltage equal to or larger than a potential difference between a standard oxidation-reduction potential of the oxidation reaction occurring in the neighborhood of the first electrode 3 and a standard oxidation-reduction potential of the reduction reaction occurring in the neighborhood of the second electrode 4. For example, the standard oxidation-reduction potential of the oxidation reaction in the formula (1) is 1.23 V, and the standard oxidation-reduction potential of the reduction reaction in the formula (2) is −0.1 V. Therefore, the open-circuit voltage of the photoelectric conversion layer 2 needs to be 1.33 V or more.

The open-circuit voltage of the photoelectric conversion layer 2 is preferable to be equal to or more than the potential difference inclusive of an overvoltage. Concretely, when the overvoltages of the oxidation reaction in the formula (1) and the reduction reaction in the formula (2) are 0.2 V respectively, the open-circuit voltage of the photoelectric conversion layer 2 is desired to be 1.73 V or more.

In the neighborhood of the second electrode 4 and the second catalyst layer 7, it is possible to cause not only the reduction reaction from $CO_2$ to CO expressed by the formula (2) but also a reduction reaction from $CO_2$ to formic acid (HCOOH), methane ($CH_4$), ethylene ($C_2H_4$), methanol ($CH_3OH$), ethanol ($C_2H_5OH$), or the like. It is also possible to reduce $H_2O$ in the second electrolytic solution 23B to generate $H_2$. By varying an amount of $H_2O$ in the second electrolytic solution 23B, it is possible to change a reduced substance of $CO_2$ to be produced. For example, it is possible to change a production ratio of CO, HCCOH, $CH_4$, $C_2H_4$, $CH_3OH$, $C_2H_5OH$, $H_2$, or the like.

Figure 9:
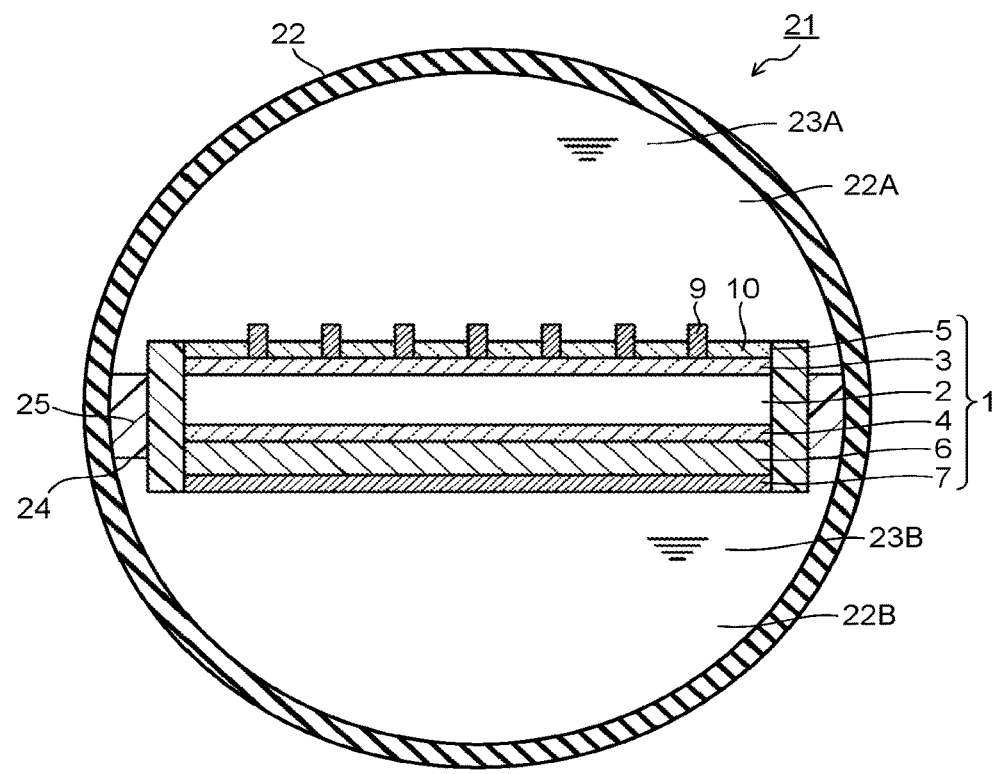
FIG. 9 is a diagram showing a second example of the photo-electrochemical reaction device using the photo-electrochemical cell of the embodiment.
Figure 10:
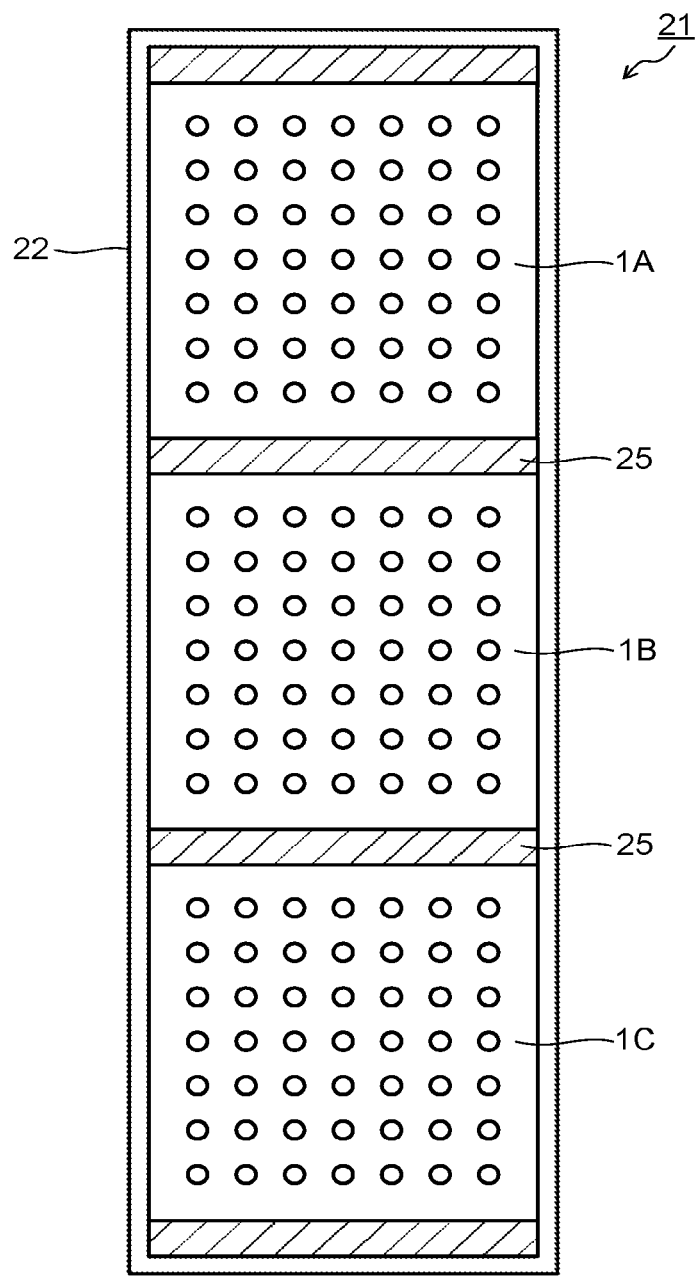
FIG. 10 is a diagram showing a third example of the photo-electrochemical reaction device using the photo-electrochemical cell of the embodiment.

A shape of an electrolytic bath 22 may be a cylindrical shape as shown in FIG. 9. The photo-electrochemical reaction device 21 is constructed by disposing the photo-electrochemical cell 1 in the cylindrical electrolytic bath 22. According to the cylindrical electrolytic bath 22, the photo-electrochemical cell 1 can be made longer easily. When the photo-electrochemical cell 1 is to be made longer, as shown in FIG. 10, a plurality of photo-electrochemical cells 1A, 1B, 1C are arranged in a straight line. Ion exchange membranes 25 are disposed between the plurality of photo-electrochemical cells 1A, 1B, 1C. The photo-electrochemical cells 1A, 1B, 1C are connected in series from the first catalyst layer 5 to the second catalyst layer 7, respectively. The photo-electrochemical cells 1A, 1B, 1C are connected in series. By using the plurality of photo-electrochemical cells 1A, 1B, 1C connected in series, even if light is not irradiated to a part of cells because the sun is veiled by cloud, for example, it becomes possible to continue a photo-electrochemical reaction by the other cells without causing a large loss in efficiency.

According to the photo-electrochemical reaction device 21 of the embodiment, since the first catalyst layer 5 disposed on the light receiving side is constituted with the plurality of catalyst parts 9 and the transparent dielectric part 10 disposed in the gap thereof, it is possible to prevent corrosion of the photoelectric conversion layer 2 by the electrolytic solution while securing the light amount incident to the photoelectric conversion layer 2. Further, since migration of the carrier in an in-plane direction of the photo-electrochemical cell 1 can be prevented, occurrence of the resistance loss can be suppressed. Thereby, it becomes possible to provide a photo-electrochemical reaction device 21 which has a high conversion efficiency from light energy by sunlight or the like into chemical energy and which is excellent in durability. Further, area enlargement is possible without impairing the efficiency of the photo-electrochemical cell 1. Thereby, it becomes possible to provide a photo-electrochemical reaction device 21 having a photo-electrochemical cell 1 in which a high efficiency, a high durability, and area enlargement are materialized.

Next, concrete examples of the present invention and evaluation results thereof will be described.

EXAMPLE 1

Figure 11:
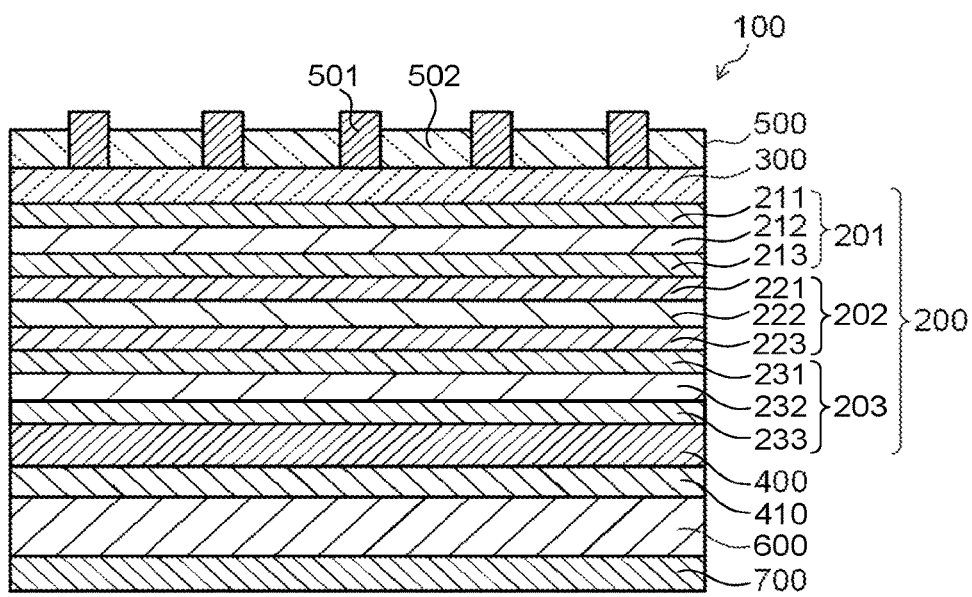
FIG. 11 is a cross-sectional view showing a concrete configuration example of the photo-electrochemical cell according to the embodiment.

In an example 1, there is fabricated a photo-electrochemical cell 1 in which is disposed a first catalyst layer 5 that is constituted with a plurality of catalyst parts 9 on a light incident surface side of a three junction photoelectric conversion layer and a transparent dielectric part 10 disposed in a gap thereof, and a characteristic thereof is evaluated. FIG. 11 shows a structure of a three junction photo-electrochemical cell.

First, there is prepared a structure that has a three-junction photoelectric conversion layer 200 (500 nm in thickness) which has a pin-type amorphous silicon (a-Si) 201 and two kinds of pin-type amorphous silicon germanium (as-SiGe) 202, 203, an ITO layer 300 (100 nm in thickness) as a first electrode, a ZnO layer 400 (300 nm in thickness) as a second electrode, an Ag reflection layer 410 (200 nm in thickness), and a stainless steel substrate 600 (1.5 µm in thickness) as a supporting substrate. Each layer on the stainless steel substrate of this structure has a texture structure of a submicron order in order to obtain a light confinement effect.

The three junction photoelectric conversion layer 200 is constituted with the first photoelectric conversion layer 201, the second photoelectric conversion layer 202, and the third photo-electric conversion layer 203. The first photoelectric conversion layer 201, the second photoelectric conversion layer 202, and the third photoelectric conversion layer 203 are each a photoelectric conversion layer of pin-junction, and each have different absorption wavelengths of light. By stacking these photoelectric conversion layers 201, 202, 203 in a plane state, it is possible to absorb light of a broad wavelength range of sunlight and it becomes possible to use energy of sunlight more efficiently. As a result, it is possible to obtain a high open-circuit voltage by the photoelectric conversion layer 200.

Concretely, the first photoelectric conversion layer 201 is constituted with a stacked body of a p-type microcrystalline silicon (µc-Si) layer 211/an intrinsic amorphous silicon (a-Si) layer 212/an n-type a-Si layer 213 which are stacked in sequence from a light incident surface. The a-Si layer 212 is a layer that absorbs light in a short wavelength range of about 400 nm. In the first photoelectric conversion layer 201, charge separation is caused by energy of light in the short wavelength range.

The second photoelectric layer 202 is constituted with a stacked body of a p-type µc-Si layer 221/an intrinsic a-SiGe layer 222/an n-type a-Si layer 223 which are stacked in sequence from a light incident surface. The a-SiGe layer 222 is a layer that absorbs light in a medium wavelength range of about 600 nm. In the second photoelectric conversion layer 202, charge separation is caused by energy of light in the medium wavelength range.

The third photoelectric layer 203 is constituted with a stacked body of a p-type µc-Si layer 231/an intrinsic a-SiGe layer 232/an n-type a-Si layer 233 which are stacked in sequence from a light incident surface. The a-SiGe layer 232, different from the a-SiGe layer 222 used in the second photoelectric conversion layer 202 in composition ratio, is a layer that absorbs light in a long wavelength range of about 700 nm. In the third photoelectric conversion layer 203, charge separation is caused by energy of light in the long wavelength range. In the structure used in the example 1, as a result that an open-circuit voltage is measured in a case where light irradiation is carried out by using a solar simulator (AM 1.5, 1000 W/m$^2$), the open-circuit voltage is 2.1 V.

Next, a composite structure of a catalyst parts 501 and a transparent dielectric part 502 is formed on the ITO layer 300. First, after a negative-type photosensitive epoxy resist (SU-8 3005 (trade name, manufactured by Nippon Kayaku Co., Ltd.)) of about 5 µm in thickness is applied onto the ITO layer 300 by a spin coating method, prebaking processing is performed on a hot plate. The photosensitive epoxy resist is used as a permanent resist and becomes the transparent dielectric part 502.

Next, by performing exposure and developing treatment by an i-line exposure apparatus using a mask, openings are provided in an epoxy resin layer on the ITO layer 300. Curing is performed in an oven in order to thermoset the epoxy resin layer, and further, ashing is performed for the purpose of hydrophilization in order to form a catalyst layer uniformly at a time of electrodeposition of a catalyst. Thereafter, an Ni(OH)$_2$ catalyst is formed in exposed portions of the ITO layer 300 as oxidation catalysts of water by an electrodeposition method. A film thickness of the catalyst layer is set to be 100 nm.

The composite structure of catalyst/transparent dielectric formed in the example 1 has a shape that catalyst parts of 20 µm in diameter are arranged in a triangular lattice shape. An average value of distances connecting a center of the catalyst part and a center of the adjacent catalyst part is 34.5 µm. An area ratio of the catalyst layer (percentage occupied by the catalyst parts in a light irradiation surface viewed from a light incident surface side) is 30%. There is evaluated a transmittance in relation to sunlight of the composite structure of catalyst/transparent dielectric fabricated on a glass substrate by a similar method, and a value is about 75%. A transmittance of sunlight is calculated, after a light transmittance $t(\lambda)$ of wavelengths ($\lambda$) from 300 to 1000 nm is measured by a spectrophotometer, by computation using a known sunlight spectrum I ($\lambda$) (sunlight transmittance $T=\Sigma t(\lambda) \times I(\lambda)/\Sigma I(\lambda)$).

Subsequently, as a reduction catalyst, a Pt film (1000 nm in thickness) of a hydrogen generating catalyst is film-formed on a rear surface of the stainless steel substrate 600 by a vacuum sputtering method. Thereafter, a cell is cut out in a square shape and an edge portion is sealed by a thermosetting epoxy resin, so that an area of an exposed portion of the light irradiation surface becomes 1 cm$^2$.

Comparative Example 1-1

There is prepared a cell having a structure the same as that of the example 1 except that only an Ni(OH)$_2$ catalyst of a thin film shape is formed on an entire surface of an ITO layer of the cell. A thickness of the Ni(OH)$_2$ catalyst is 15 nm.

Comparative Example 1-2

There is prepared a cell having a structure the same as that of the comparative example 1-1 except that a thickness of an Ni(OH)$_2$ catalyst layer is set to be 30 nm.

Comparative Example 1-3

There is prepared a cell having a structure the same as that of the comparative example 1-1 except that a thickness of an Ni(OH)$_2$ catalyst layer is set to be 45 nm.

Efficiencies of photo-electrochemical reactions by the cells of the aforementioned example 1 and comparative examples 1 are measured. The efficiency of the photo-electrochemical reaction is measured as follows. First, the cell is immersed in an electrolytic solution tank of a closed system which includes a strong alkaline solution of 1M-NaOH as an electrolytic solution. On this occasion, by attaching a cation-exchange membrane (Nafion (trade name, manufactured by Du Pont)) in a periphery portion of the cell by using an epoxy resin as in FIG. 8, the solution is divided into two of an oxidation side and a reduction side.

Next, light is irradiated to an oxidation catalyst layer surface by using a solar simulator (AM 1.5, 1000 W/m$^2$). Quantitative analysis of gas in the electrolytic solution tank is carried out every predetermined period by gas chromatography analysis (GC). As a result of analysis, identified gas kinds are oxygen on the oxidation side and hydrogen on the reduction side. In the evaluation, a time from start of light irradiation until occurrence of hydrogen is not confirmed is an endurance time and an average value per a unit time of hydrogen generation amounts from the start of light irradiation through the endurance time is a production efficiency. The endurance time is multiplied by the production efficiency, to obtain a production amount. The endurance time and the production efficiency in the cell of the comparative example 1-1 being set to be "1", the endurance time and the production efficiency of each cell are calculated as relative values to the comparative example 1-1. The results are shown in Table 1.

catalyst layer, the efficiency is higher compared with the comparative example 1-2 and the comparative example 1-3. As a result, when compared in generation amount, it is confirmed that the cell of the example 1 is capable of producing hydrogen of about five times compared with the comparative example 1-1.

EXAMPLES 2

In example 2, eight kinds of photo-electrochemical cells with different area ratios of catalyst parts in the composite structures of catalyst/transparent dielectric are fabricated and evaluated. A manufacturing method of the cell is similar to that in the example 1. On this occasion, by changing mask patterns used at a time of exposure of photosensitive epoxy resins arbitrarily, transparent dielectric parts having opening part patterns different in terms of diameter are formed in the cells of the examples 2-1 to 2-8. An Ni(OH)$_2$ catalyst layer

TABLE 1

|  | ENDURANCE TIME (a.u.) | PRODUCTION EFFICIENCY (a.u.) | PRODUCTION AMOUNT (a.u.) |
|---|---|---|---|
| COMPARATIVE EXAMPLE 1-1 | 1 | 1 | 1 |
| COMPARATIVE EXAMPLE 1-2 | 2.5 | 0.61 | 1.52 |
| COMPARATIVE EXAMPLE 1-3 | 3 | 0.45 | 1.35 |
| EXAMPLE 1 | 6 | 0.82 | 4.92 |

As is obvious from Table 1, in the photo-electrochemical cell in which the catalyst of the thin film shape is formed on the entire light receiving surface as in the comparative example 1-1, 1-2, or 1-3, the endurance time is improved as the film thickness of the catalyst layer becomes larger. In the comparative example 1-1, since the film thickness of the catalyst layer is too small and the ITO surface is not coated uniformly with the catalyst layer, the endurance time is short. However, the efficiency is decreased as the catalyst layer becomes thicker due to occurrence of an optical loss, and the endurance time and the efficiency are in a relation of trade-off.

In the example 1, because of use of the composite structure of the catalyst layer which is sufficiently thicker than those of the comparative examples 1-1 to 1-3 and the transparent dielectric layer excellent in corrosion resistance, it is possible to suppress corrosion by the electrolytic solution. With regard to the endurance time in the example 1, improvement of six times that in the comparative example 1-1 is recognized. In the example 1, since the light receiving surface of light can be secured as a result of patterning of the of 500 nm is formed in the opening. The composite structure of catalyst/transparent dielectric has a triangular lattice shape. An average distance among the catalyst parts is 100 μm. The area ratios are controlled by changing the diameters of the catalyst parts. Reduction catalysts are similar to that in the example 1.

Evaluation of the cells is performed by a method similar to that in the example 1. Evaluation results are shown in Table 2. Sunlight transmittances measured when structures similar to the composite structures formed in the respective cells are formed on glass substrates are also shown. As is obvious from Table 2, when the area ratio of the catalyst part is changed in the composite structure of catalyst/transparent dielectric, a certain effect can be obtained with regard to an endurance time by applying the composite structure of catalyst/transparent dielectric, and little influence is shown. On the other hand, with regard to a production ratio, it is found that a light transmission amount in catalyst/transparent dielectric becomes higher as the area ratio of the catalyst parts becomes lower, and that an obtained efficiency is improved. However, when the area ratio of the catalyst parts becomes less than 5%, a reaction overvoltage by which a catalytic effect can be obtained is increased, and a the production efficiency is rapidly decreased.

TABLE 2

|  | CATALYST LAYER AREA RATIO (%) | SUNLIGHT TRANSMITTANCE (%) | ENDURANCE TIME (a.u.) | PRODUCTION EFFICIENCY (a.u.) | PRODUCTION AMOUNT (a.u.) |
|---|---|---|---|---|---|
| EXAMPLE 2-1 | 1 | 98 | 6.3 | 0.34 | 2.14 |
| EXAMPLE 2-2 | 5 | 95 | 6.4 | 0.72 | 4.61 |
| EXAMPLE 2-3 | 10 | 89 | 6.3 | 0.84 | 5.29 |
| EXAMPLE 2-4 | 20 | 81 | 6.2 | 0.76 | 4.71 |
| EXAMPLE 2-5 | 30 | 70 | 5.9 | 0.68 | 4.01 |
| EXAMPLE 2-6 | 40 | 62 | 6.0 | 0.59 | 3.54 |
| EXAMPLE 2-7 | 50 | 50 | 6.1 | 0.47 | 2.87 |
| EXAMPLE 2-8 | 60 | 42 | 6.0 | 0.42 | 2.52 |

EXAMPLES 3

In examples 3, photo-electrochemical cells with different heights of catalyst layers in composite structures of catalyst/transparent dielectric are fabricated and evaluated. A structure similar to that in the example 1 being prepared, similarly to in the example 1, a photosensitive epoxy resin is applied onto an ITO layer, and line-shaped openings are provided in a photosensitive epoxy resin layer by exposure and developing treatment. A thickness of the photosensitive epoxy resin is 1 µm. Thereafter, a cobalt oxide layer is formed as a hydroxide catalyst in the opening by an electrodeposition method. When a catalyst layer thicker than 1 µm is to be formed, after applying a photosensitive epoxy resin layer to have a thickness sufficiently larger than a thickness of the catalyst layer to be formed, and thereafter, forming of an opening pattern by exposure and developing treatment and formation of the catalyst layer by electrodeposition are carried out. Lastly, by reactive ion etching (RIE) using mixed gas of oxygen and carbon tetrafluoride ($CF_4$), only the photosensitive epoxy resin layer is etched until the thickness becomes 1 µm.

The composite structure of catalyst/transparent dielectric fabricated in the example 3 has a pattern in which the catalyst parts are disposed in a lattice shape in a line pattern of 20 µm in line width, as in FIG. 2. The transparent dielectric has been divided into squares of 102 µm in edge length by the catalyst pattern. An area ratio of the catalyst parts is 30%. Subsequently, an Au film (1000 nm in thickness) of $CO_2$ reduction catalyst is film-formed as a reduction catalyst layer on a rear surface of an SUS substrate by a vacuum sputtering method. Next, a cell is cut out in a square shape and an edge portion is sealed with a thermosetting epoxy resin, so that an area of an exposed portion of a light irradiation surface becomes 1 $cm^2$.

Comparative Example 3-1

There is prepared a cell having a structure the same as that in the example 3 except that only a cobalt oxide catalyst of a thin film shape is formed on an ITO surface of the cell. A thickness of the cobalt oxide catalyst is 10 nm.

Comparative Example 3-2

There is prepared a cell having a structure the same as that in the comparative example 3-1 except that a thickness of a cobalt oxide catalyst is set to be 50 nm.

Efficiencies of photo-electrochemical reactions by the cells of the aforementioned examples 3 and comparative examples 3 are measured. The efficiency of the photo-electrochemical reaction is measure as follows. First, the cell is immersed in an electrolytic solution tank of a closed system that includes a 0.1M-$KHCO_3$ solution to which bubbling of $CO_2$ gas has been carried out for sixty minutes. On this occasion, by attaching a cation-exchange membrane to a periphery portion of the cell by using an epoxy resin similarly to in the example 1, the solution is divided into two of an oxidation side and a reduction side. Next, irradiation is carried out to an oxidation side catalyst layer surface by using a solar simulator (AM 1.5, 1000 W/$m^2$). Thereafter, quantitative analysis of gas in the electrolytic solution tank is carried out every predetermined period by GC. As a result of analysis, identified gas kinds are oxygen, hydrogen, and carbon monoxide. The generated carbon monoxide derives from $CO_2$ reduction.

In the evaluation, a time from start of light irradiation until generation of CO is not confirmed is an endurance time. An average value per a unit time of CO generation amounts from the start of irradiation through the endurance time is a production efficiency. The endurance time is multiplied by the production efficiency, to obtain a production amount. The endurance time and the production efficiency in the cell of the comparative example 3-1 being set to be "1", the endurance time and the production efficiency of each cell are calculated as relative values to the comparative example 3-1. The results are shown in Table 3.

TABLE 3

|  | CATALYST LAYER THICKNESS (µm) | ENDURANCE TIME (a.u.) | PRODUCTION EFFICIENCY (a.u.) | PRODUCTION AMOUNT (a.u.) |
|---|---|---|---|---|
| COMPARATIVE EXAMPLE 3-1 | 0.01 | 1 | 1 | 1.00 |
| COMPARATIVE EXAMPLE 3-2 | 0.05 | 3 | 0.35 | 1.05 |
| EXAMPLE 3-1 | 0.1 | 7.8 | 0.62 | 4.84 |
| EXAMPLE 3-2 | 0.5 | 8.1 | 0.75 | 6.08 |
| EXAMPLE 3-3 | 1 | 8.3 | 0.79 | 6.56 |
| EXAMPLE 3-4 | 10 | 8.1 | 0.82 | 6.64 |

TABLE 3-continued

|  | CATALYST LAYER THICKNESS (μm) | ENDURANCE TIME (a.u.) | PRODUCTION EFFICIENCY (a.u.) | PRODUCTION AMOUNT (a.u.) |
|---|---|---|---|---|
| EXAMPLE 3-5 | 50 | 8.3 | 0.75 | 6.23 |
| EXAMPLE 3-6 | 100 | 8.3 | 0.62 | 5.15 |

As is obvious from Table 3, when the thickness of catalyst layer in composite structure of catalyst/transparent dielectric is changed, catalyst activity is improved as the catalyst layer becomes thicker, and thus obtained efficiency becomes higher. However, when the thickness of the catalyst layer is sufficiently large, a loss (resistance loss) of migration of an electron or a positive hole carried from a photoelectric conversion layer occurs, and activity of catalyst parts is not largely changed after exceeding a certain height.

EXAMPLES 4

In examples 4, photo-electrochemical cells having composite structures of catalyst/transparent dielectric with different distances among catalysts are fabricated and evaluated. A structure similar to that in the example 1 is prepared. Next, the composite structure of catalyst/transparent dielectric is formed on an ITO layer. A resist layer is applied onto the ITO layer by spin coating. Next, by carrying out exposure treatment by an i line or an electron beam and subsequently carrying out developing treatment, an opening pattern is formed in the resist layer. Subsequently, a cobalt oxide of 1 μm is formed as a hydroxide catalyst in an opening of the resist layer by electrodeposition. Thereafter, only the resist layer is peeled by using an organic solvent, and a fluorocarbon resin (Cytop (trade name, manufactured by ASAHI GLASS CO., LTD.)) is applied as a transparent dielectric layer on the catalyst layer. Lastly, by carrying out RIE treatment using mixed gas of oxygen and $CF_4$, the transparent dielectric layer is selectively etched until the catalyst layer is exposed, so that the composite structure of catalyst/transparent dielectric is formed on the ITO layer.

The composite structures of catalyst/transparent dielectric fabricated in the examples 4 have patterns in which dot-shaped catalyst parts are arranged in triangular lattice shapes. Area ratio of the catalyst part is 15% each and a diameter of the catalyst part and a distance among catalyst parts are changed. Subsequently, an Ag film (1000 nm in thickness) of a $CO_2$ reduction catalyst is film-formed as a reduction catalyst layer on a rear surface of an SUS substrate by a vacuum deposition method. Next, a cell is cut out in a square shape and an edge portion is sealed with a thermo-setting epoxy resin, so that an area of an exposed portion of a light irradiation surface becomes 9 $cm^2$.

Comparative Example 4-1

There is prepared a cell having a structure the same as those of the examples 4 except that only a cobalt oxide catalyst of a thin film shape is formed on an ITO surface of the cell. A thickness of the cobalt oxide catalyst is 10 nm.

Comparative Example 4-2

There is prepared a cell having a structure the same as that of the comparative example 4-1 except that a thickness of a cobalt oxide catalyst is set to be 50 nm.

Efficiencies of photo-electrochemical reactions by the cells of the aforementioned examples 4 and comparative examples 4 are measured. The efficiency of the photo-electrochemical reaction is measured as follows. First, the cell is immersed in an electrolytic solution tank of a closed system that includes a 0.1M-$NaHCO_3$ solution to which bubbling of $CO_2$ gas has been carried out for sixty minutes. On this occasion, by attaching a cation-exchange membrane to a periphery portion of the cell by using an epoxy resin similarly to in the example 1, the solution is divided into two of an oxidation side and a reduction side. Next, irradiation is carried out to an oxidation side catalyst layer surface by using a solar simulator (AM 1.5, 1000 W/$m^2$). Thereafter, quantitative analysis of gas in the electrolytic solution tank is carried out every predetermined period by GC. As a result of analysis, identified gas kinds are oxygen, hydrogen, and carbon monoxide. The generated carbon monoxide derives from $CO_2$ reduction.

In the evaluation, a time from start of light irradiation until generation of CO is not confirmed is an endurance time. An average value per a unit time of CO generation amounts from the start of light irradiation through the endurance time is a production efficiency. The endurance time is multiplied by the production efficiency, to obtain a production amount. With the endurance time and the production efficiency in the cell of the comparative example 4-1 being set to be "1", the endurance time and the production efficiency of each cell are calculated as relative values to the comparative example 4-1. The results are shown in Table 4.

TABLE 4

|  | CATALYST PART DIAMETER (μm) | DISTANCE AMONG CATALYST PARTS (μm) | ENDURANCE TIME (a.u.) | PRODUCTION EFFICIENCY (a.u.) | PRODUCTION AMOUNT (a.u.) |
|---|---|---|---|---|---|
| COMPARATIVE EXAMPLE 4-1 | — | — | 1.00 | 1.00 | 1.00 |
| COMPARATIVE EXAMPLE 4-2 | — | — | 3.20 | 0.30 | 0.96 |
| EXAMPLE 4-1 | 0.02 | 0.10 | 8.00 | 0.92 | 7.36 |
| EXAMPLE 4-2 | 0.20 | 1.00 | 8.20 | 0.91 | 7.46 |
| EXAMPLE 4-3 | 2.03 | 10.0 | 8.10 | 0.90 | 7.29 |

TABLE 4-continued

|  | CATALYST PART DIAMETER (μm) | DISTANCE AMONG CATALYST PARTS (μm) | ENDURANCE TIME (a.u.) | PRODUCTION EFFICIENCY (a.u.) | PRODUCTION AMOUNT (a.u.) |
|---|---|---|---|---|---|
| EXAMPLE 4-4 | 20.3 | 100 | 8.20 | 0.88 | 7.22 |
| EXAMPLE 4-5 | 203 | 1000 | 8.30 | 0.85 | 7.06 |
| EXAMPLE 4-6 | 407 | 2000 | 8.20 | 0.82 | 6.72 |

As is obvious from Table 4, in composite structure of catalyst/transparent dielectric, it is found that as a distance among the catalyst parts are shorter a higher efficiency can be obtained. This is because the long distance among the catalyst parts makes a distance for which a carrier migrates in the ITO layer longer and brings about deterioration of the efficiency due to a resistance loss by ITO.

EXAMPLES 5

In examples 5, cells in which reduction catalyst layers are disposed on light incident surfaces of photo-electrochemical cells are fabricated and evaluated. First, there is prepared a structure which has a pn-junction type three-junction photoelectric conversion layer made of an InGaP layer, an InGaAs layer, and a Ge layer, an ITO transparent conductive film formed on an incident surface of the photoelectric conversion layer, and an Au electrode formed on a rear surface of the photoelectric conversion layer.

A detailed configuration of the three-junction photoelectron conversion layer is, from a light incident surface side, n-InGaAs (contact layer)/n-AlInP (window layer)/n-InGaP/p-InGaP/p-AlInP (Back Surface Field (BSF)layer)/p-AlGaAs (tunnel layer)/p-InGaP (tunnel layer)/n-InGaP (window layer)/n-InGaAs/p-InGaP (BSF layer)/p-GaAs (tunnel layer)/n-GaAs (tunnel layer)/n-InGaAs/p-Ge (substrate).

Next, as a transparent dielectric layer, an epoxy resin of 50 μm in thickness is applied in a shape of a pattern having openings onto an ITO layer by an ink jet method. Next, Au of 1 μm in thickness is formed as a $CO_2$ reduction catalyst in the opening by electrolytic plating. The composite structure of catalyst/transparent dielectric formed in the example 5 has a pattern in which line-shaped catalyst parts are disposed in a lattice shape. The pattern is one in which the Au layer is 5.9 μm in line width and disposed in the lattice shape and the transparent dielectric layer is divided into squares of 50 μm in edge length by catalyst layers, an area ratio thereof being 20%.

Next, an SUS substrate is prepared, and a ruthenium oxide film as a hydroxide catalyst is film-formed thereon by a sputtering method. This ruthenium oxide/SUS substrate is used as a counter electrode. Subsequently, after a cell and the counter electrode are cut out in squares of 4 $cm^2$, the SUS substrate and the Au electrode layer on the photoelectric conversion layer rear surface are electrically connected by using a copper wire. Lastly, sealing with an epoxy resin is carried out in a manner that only a composite structure surface of catalyst/transparent dielectric and an oxide catalyst surface are exposed to an electrolytic solution.

Comparative Example 5-1

There is prepared a cell having a structure the same as that in the example 5 except that only an Au catalyst of a thin film shape is formed on an ITO surface of the cell. A thickness of the Au catalyst is 5 nm.

Comparative Example 5-2

There is prepared a cell having a structure the same as that in the comparative example 5-1 except that a thickness of an Au catalyst is set to be 10 nm.

Next, the fabricated photo-electrochemical cell is immersed in an electrolytic solution tank of a closed system that includes a 0.1M-$KHCO_3$ solution to which bubbling of $CO_2$ gas has been carried out for sixty minutes. On this occasion, a reduction catalyst part and an oxidation catalyst part are divided by being separated by means of a cation-exchange membrane (Nafion). Next, light is irradiated to a reduction catalyst layer surface by using a solar simulator (AM 1.5, 1000 W/$m^2$). Thereafter, quantitative analysis of gas in the electrolytic solution tank is carried out every predetermined period by GC. As a result of analysis, identified gas kinds on the reduction catalyst side are hydrogen and carbon monoxide.

As a result of measurement, it is confirmed that in the examples 5, efficiencies, endurance times, and production amounts of CO are higher compared with the comparative examples 5-1, 5-2. A reason why the higher efficiencies can be obtained in the examples 5 in relation to the comparative examples 5-1, 5-2 is that optical losses become high in the comparative examples 5 since metal catalysts are formed on entire surfaces of light incident surfaces. In the comparative examples, the efficiencies are low compared with the structures of the examples.

EXAMPLE 6-1

As a photoelectric conversion layer, a structure similar to that in the example 1 is prepared. Next, a platinum film is formed as a hydrogen generating catalyst of 1 μm in thickness on a rear surface of an SUS substrate by a sputtering method. Subsequently, a photosensitive epoxy resin of 50 μm in thickness is applied onto an ITO layer, and dot-shaped openings are provided in a photosensitive epoxy resin layer by exposure and developing treatment. Thereafter, nickel is formed in a thickness of 50 μm as a conductive layer in the opening by electrolytic plating. Subsequently, only the photosensitive epoxy resin layer is etched until a thickness thereof becomes 5 μm by RIE processing using mixed gas of $O_2$ and $CF_4$. On this occasion, the nickel layer is column-shaped.

Subsequently, a cobalt hydroxide catalyst of 20 nm in thickness as an oxidation catalyst is formed on an exposed surface of the nickel layer by an electrodeposition method. A pattern of catalyst/transparent dielectric viewed from a light incident surface is an arrangement pattern of dot-shaped catalyst parts in a triangular lattice. An area ratio of the catalyst parts on this occasion is 10%. Next, a cell is cut out in a square shape and an edge portion is sealed with a thermosetting epoxy resin, so that an area of an exposed portion of a light irradiation surface becomes 1 $cm^2$.

EXAMPLE 6-2

In an example 6-2, fabrication as far as to formation of a nickel layer by electrolytic plating is carried out similarly to in the example 6-1, and thereafter, a photosensitive epoxy resin layer is etched until the photosensitive epoxy resin layer becomes 5.5 µm by RIE processing using mixed gas of $O_2$ and $CF_4$. Next, by carrying out RIE processing using only argon plasma, a nickel pillar portion is acuminated into a tapered shape. Next, RIE processing using mixed gas of $O_2$ and $CF_4$ is carried out again, and etching is done until the photosensitive epoxy resin layer becomes 5 µm in thickness. Thereafter, a cobalt hydroxide catalyst of 20 nm in thickness is formed on a nickel layer surface by electrodeposition, and a cell of 1 $cm^2$ is fabricated similarly to in the example 6-1.

EXAMPLE 6-3

A structure similar to that in the example 6-1 is prepared, and a Pt film of 1 µm is formed on a rear surface of an SUS substrate by a sputtering method. Subsequently, a photosensitive epoxy resin of 5 µm in thickness is applied onto an ITO surface and dot-shaped openings are provided by exposure/developing treatment. A cobalt hydroxide catalyst of 20 nm in thickness is formed in the opening by electrodeposition, to fabricate a cell of 1 $cm^2$ similarly to in the example 6-1.

An efficiency of a photo-electrochemical reaction is measured as follows. First, the cell is immersed in an electrolytic solution tank of a closed system that includes a phosphate buffer (pH=6.7) as an electrolytic solution. On this occasion, a cation-exchange membrane is attached to a periphery portion of the cell by using an epoxy resin, whereby the solution is divided into two of an oxidation side and a reduction side. Next, evaluation similar to that in the example 1 is carried out. On this occasion, a relative value of each cell at a time that an endurance time and a production efficiency of the example 6-3 are set to be "1" is calculated. Results are shown in Table 5.

TABLE 5

| | ENDURANCE TIME (a.u.) | PRODUCTION EFFICIENCY (a.u.) | PRODUCTION AMOUNT (a.u.) |
|---|---|---|---|
| EXAMPLE 6-1 | 5.4 | 1.05 | 5.7 |
| EXAMPLE 6-2 | 5.3 | 1.10 | 5.8 |
| EXAMPLE 6-3 | 1.0 | 1.00 | 1.0 |

As is obvious from Table 5, the endurance times in the examples 6-1, 6-2 in which the conductive layers are had are longer than that in the example 6-3. This is because, while corrosion of the electrolytic solution occurs from the catalyst layer in the example 6-3, durabilities are improved by introducing the conductive layers. Further, in the examples 6-1, 6-2, the efficiencies are high since heights of the catalyst layers are larger than that in the example 6-3. In particular, the efficiency is the highest in the example 6-2. This is because a use efficiency of light becomes high by making the conductive layer taper shaped.

EXAMPLE 7

In an example 7, a photo-electrochemical cell which has an anodically oxidized aluminum film being an inorganic material is fabricated as a transparent dielectric layer and evaluated. First, there is prepared a structure which has a three-junction photoelectric conversion layer (500 nm in thickness) which is made of pin-type a-Si/a-SiGe/a-SiGe similar to that in the example 1 as a photoelectric conversion layer, an ITO electrode (100 nm in thickness) as a transparent conductive film on the photoelectric conversion layer, and a ZnO electrode (300 nm in thickness) as an electrode layer on a lower surface of the photoelectric conversion layer, and has an Ag reflection layer (200 nm in thickness) on a lower surface of the electrode layer and an SUS substrate (1.5 µm in thickness) as a supporting substrate.

Next, an Al film of 500 µm in thickness is formed on an ITO layer by a sputtering method. Next, first-stage anodic oxidation is carried out in an oxalic acid solution of 0.3 mol/L (15 ° C.) at 40V. Subsequently, second-stage anodic oxidation is carried out under the same condition, to form a porous alumina layer which has dot-shaped openings on an ITO substrate. Next, by carrying out etching by a potassium hydroxide, the alumina layer existing in the opening is removed and the ITO layer is exposed. The formed openings of the porous alumina are disposed in a triangular lattice shape, an average diameter being 50 nm and an average distance among the openings being 100 nm.

Thereafter, a cobalt oxide catalyst being an oxidation catalyst is film-formed until the cobalt oxide catalyst is filled into the opening of porous alumina, by an atomic layer deposition method (ALD). Thereafter, the cobalt oxide catalyst film-formed on the porous alumina layer is removed by Ar ion milling. A thickness of a composite structure of the oxide cobalt catalyst and the alumina layer on this occasion is 300 nm. Subsequently, an Au film (1000 nm in thickness) of a $CO_2$ reduction catalyst is film-formed as a reduction catalyst layer on a rear surface of the SUS substrate by a vacuum deposition method. Next, a cell is cut out in a square shape, and an edge portion is sealed with a thermosetting epoxy resin, so that an area of an exposed portion of a light irradiation surface becomes 1 $cm^2$.

Comparative Example 7-1

There is prepared a cell having a structure the same as that in the example 7 except that only a cobalt oxide catalyst of a thin film shape is formed on an ITO surface of the cell. A thickness of the cobalt oxide catalyst is 10 nm.

Comparative Example 7-2

There is prepared a cell having a structure the same as that in the comparative example 7-1 except that a thickness of a cobalt oxide catalyst is set to be 50 nm.

Characteristics of the fabricated photo-electrochemical cells are evaluated similarly to in the example 3. As a result of evaluation, the cell in the example 7 has a longer endurance time and larger production amount compared with the comparative examples 7-1, 7-2.

EXAMPLE 8

In an example 8, a photo-electrochemical cell that has a catalyst layer in which a transparent dielectric part is disposed in a gap among stacked parts of conductive parts and catalyst parts is fabricated and evaluated. First, similarly to in the example 1, there is prepared a structure which has an ITO electrode (100 nm in thickness), a three junction photoelectric conversion layer (500 nm in thickness) made of pin type a-Si/a-SiGe/a-SiGe, a ZnO electrode (300 nm in thickness), an Ag reflection layer (200 nm in thickness), and an SUS substrate (1.5 µm in thickness).

Next, a TiN film of 10 nm in thickness is formed as a conductive film on an ITO layer by an atomic layer deposition method. A plurality of catalyst parts are disposed on the TiN film at a predetermined interval. The plurality of catalyst parts are formed as follows. After a positive type resist of about 5 μm in thickness is applied onto the TiN film by spin coating, pre-baking processing is carried out on a hot plate. By carrying out exposure and developing treatment by an i-line exposure apparatus using a mask, a plurality of openings are provided in a resist layer. In order to heighten uniformity of the catalyst layer at a time of electrodeposition, ashing is carried out for the purpose of hydrophilization. By an electrodeposition method using a nickel nitrate, an $Ni(OH)_2$ catalyst is formed as an oxidation catalyst of water in the opening of the mask (exposed portion of the ITO layer). As a result of peeling the resist layer by using an organic solvent, catalyst parts (catalyst layers) having a gap portion are formed.

A thickness of the catalyst part (catalyst layer) is 200 nm. A shape of the stacked part of the catalyst part and the conductive part is 20 μm in diameter, and such stacked parts are arranged in a triangular lattice shape. An average value of distances connecting a center of the stacked part (catalyst part) and a center of the adjacent stacked part (catalyst part) is 34.5 μm. An area ratio (percentage occupied by the catalyst parts in a light irradiation surface viewed from a light incident surface side) of the stacked part (catalyst part) is 30%. A transmittance of the stacked part (catalyst part) fabricated on a glass substrate with an ITO film in relation to sunlight, which is evaluated by a similar method, is about 72%. A transmittance of sunlight is calculated by the method indicated in the example 1.

Next, a portion exposed among the stacked parts (catalyst parts) of the TiN film is subjected to oxidation processing. The oxidation processing is carried out by anodic oxidation. In a sodium hydroxide aqueous solution of 1 mol/L are immersed a sample as a working electrode, Hg/Hgo (1M-NaOH) as a reference electrode, and a platinum wire as a counter electrode, whereby anodic oxidation is carried out. When immersing in an electrolytic solution is carried out, protection by a Kapton tape is done so that only a light incident surface of the sample may be exposed. It is confirmed in advance by a cyclic voltammetry method that oxidation of TiN occurs at a potential higher than +0.75 V (reference electrode comparison). The anodic oxidation of the TiN film is carried out at +1.5 V (reference electrode comparison) for ten minutes. As a result of analysis by X-ray photoelectron spectroscopy (XPS), it is confirmed that an oxygen amount in the TiN film before the anodic oxidation processing is about 5 atomic % while an oxygen amount after the processing is increased as far as about 95 atomic %.

Subsequently, a Pt film (500 nm in thickness) of a hydrogen generating catalyst is film-formed as a reduction catalyst on a rear surface of the SUS substrate by a vacuum sputtering method. Thereafter, a cell is cut out in a square shape and an edge portion is sealed with a thermosetting epoxy resin, so that an area of an exposed portion of the light irradiation surface becomes 1 $cm^2$.

Comparative Example 8-1

There is prepared a cell having a structure the same as that in the example 8 except that only an $Ni(OH)_2$ catalyst of a thin film shape is formed on an entire surface of an ITO layer of the cell without forming a TiN film and an oxide coating film of TiN. A thickness of the $Ni(OH)_2$ catalyst is 15 nm.

Comparative Example 8-2

There is prepared a cell having a structure the same as that of the comparative example 8-1 except that a thickness of an $Ni(OH)_2$ catalyst layer is set to be 30 nm.

Comparative Example 8-3

There is prepared a cell having a structure the same as that of the comparative example 8-1 except that a thickness of an $Ni(OH)_2$ catalyst layer is set to be 45 nm.

Comparative Example 8-4

There is prepared a cell having a structure the same as that in the example 8 except that an $Ni(OH)_2$ catalyst which has a gap similar to that in the example 8 is formed on an ITO layer of the cell without forming a TiN film and an oxide coating film of TiN.

Efficiencies of photo-electrochemical reactions by the cells of the aforementioned example 8 and comparative examples 8-1 to 8-4 are measured. The efficiency of the photo-electrochemical reaction is measured as follows. First, the cell is immersed in an electrolytic solution tank of a closed system which includes a strong alkaline solution of 1M-NaOH as an electrolytic solution. On this occasion, by attaching a cation-exchange membrane (Nafion (trade name, manufactured by Du Pont)) in a periphery portion of the cell by using an epoxy resin, the electrolytic solution in the tank is divided into two of an oxidation side and a reduction side.

Next, light irradiation is carried out to an oxidation catalyst layer surface side (ITO surface side) by using a solar simulator (AM 1.5, 1000 $W/m^2$). Quantitative analysis of gas in the electrolytic solution tank is carried out every predetermined period by gas chromatography analysis (GC). As a result of analysis, identified gas kinds are oxygen on the oxidation side and hydrogen on the reduction side. In the evaluation, a time from start of light irradiation until occurrence of hydrogen is not confirmed is an endurance time and an average value per a unit time of hydrogen generation amounts from the start of light irradiation through the endurance time is a production efficiency. The endurance time is multiplied by the production efficiency, to obtain a production amount. The endurance time and the production efficiency in the cell of the comparative example 8-1 being set to be "1", the endurance time and the production efficiency of each cell are calculated as relative values to the comparative example 8-1. The results thereof are shown in Table 6.

TABLE 6

| | ENDURANCE TIME (a.u.) | PRODUCTION EFFICIENCY (a.u.) | PRODUCTION AMOUNT (a.u.) |
|---|---|---|---|
| COMPARATIVE EXAMPLE 8-1 | 1 | 1 | 1 |
| COMPARATIVE EXAMPLE 8-2 | 2.5 | 0.61 | 1.52 |
| COMPARATIVE EXAMPLE 8-3 | 3.0 | 0.45 | 1.35 |
| COMPARATIVE EXAMPLE 8-4 | 0.9 | 0.85 | 0.77 |
| EXAMPLE 8 | 4.0 | 0.80 | 3.20 |

As is obvious from Table 6, in the photo-electrochemical cells in which catalysts of thin film shapes are formed on entire surfaces of light receiving surfaces as in the comparative examples 8-1, 8-2, 8-3, the endurance times are improved as film thicknesses of the catalyst layers become thicker. In the comparative example 8-1, since the film thickness of the catalyst layer is too small and the ITO surface is not covered uniformly by the catalyst layer, the endurance time is short. The efficiency is deteriorated as the catalyst layer becomes thicker due to occurrence of an optical loss. In the photo-electrochemical cell in which only the catalyst parts are arranged on the ITO surface as in the comparative example 8-4, though the efficiency is high, corrosion occurs from an exposed ITO film portion, and thus the endurance time is short.

In the example 8, since a composite structure of the stacked film of the conductive layer and the catalyst layer and a metal oxide coating film excellent in corrosion resistance is used, corrosion by the electrolytic solution is suppressed, and four-time improvement of the endurance time from the comparative example 8-1 is recognized. Since a light receiving surface of light is secured by patterning of the catalyst layer, the efficiency is higher compared with the comparative examples 8-2, 8-3. As a result, when compared in production amount, it is confirmed that in the cell of the example 8 a production amount of hydrogen of about 3.2 times can be obtained compared with the comparative example 8-1.

EXAMPLE 9

In an example 9, a cell in which a line-shaped reduction catalyst layer is disposed in a light incident surface of a photo-electrochemical cell is fabricated and evaluated. First, there is prepared a structure which has a pn-junction type three-junction photoelectric conversion layer made of an InGaP layer, an InGaAs layer, and a Ge layer, an ITO transparent conductive film formed on an incident surface of the photoelectric conversion layer, and an Au electrode formed on a rear surface of the photoelectric conversion layer. A detailed configuration of the three-junction photoelectric conversion layer is similar to that in the example 5.

An Al film of 500 nm in thickness is formed as a conductive film on an ITO layer by a vacuum sputtering method. A resist pattern having openings is formed on the Al film by a lithography method similarly to in the example 8. Next, an Au film of 1 μm in thickness as a $CO_2$ reduction catalyst is formed in the opening by a vacuum deposition method, the resist is removed, and lift-off is carried out, whereby a line-shaped Au catalyst layers are formed on the Al film. A line width of the Au catalyst layer is 5.5 μm, and the Au catalyst layers are disposed in a lattice shape. The Al film is divided into squares of 100 μm in edge length by the Au catalyst layers. In an ammonium borate aqueous solution are immersed a sample (cell) as a working electrode and a platinum wire as a counter electrode, and anodic oxidation is carried out until the Al film exposed among the Au catalyst layers is oxidized completely. On this occasion, protection by using a Kapton tape is done so that only a light incident surface of the cell may be exposed.

Next, an SUS substrate is prepared and a ruthenium oxide film as a hydroxide catalyst is film-formed thereon by a sputtering method. This ruthenium oxide/SUS substrate is used as a counter electrode. Subsequently, after the cell and the counter electrode are cut out in squares of 4 cm², the SUS substrate and an Au electrode layer on the photoelectric conversion layer rear surface are electrically connected by using a copper wire. Lastly, sealing with an epoxy resin is carried out in a manner that only the light incident surface and an oxidation catalyst surface of the cell are exposed to an electrolytic solution.

Comparative Example 9-1

There is prepared a cell having a structure the same as that in the example 9 except that only an Au catalyst layer of a thin film shape is formed on an ITO surface of the cell. A thickness of the Au catalyst layer is 5 nm.

Comparative Example 9-2

There is prepared a cell having a structure the same as that in the comparative example 9-1 except that a thickness of an Au catalyst layer is set to be 10 nm.

Comparative Example 9-3

There is prepared a cell having a structure the same as that in the example 9 except that Au catalyst layers having a gap similar to that in the example 9 are formed on an ITO layer of the cell without forming an Al film.

Next, the fabricated photo-electrochemical cell is immersed in an electrolytic solution tank of a closed system that includes a 0.1M-$KHCO_3$ solution to which bubbling of $CO_2$ gas has been carried out for sixty minutes. On this occasion, a reduction catalyst part and an oxidation catalyst part are divided by being separated by means of a cation-exchange membrane (Nafion). Next, light is irradiated onto a reduction catalyst layer surface by using a solar simulator (AM 1.5, 1000 W/m²). Thereafter, quantitative analysis of gas in the electrolytic solution tank is carried out every predetermined period by GC. As a result of analysis, identified gas kinds on the reduction catalyst side are hydrogen and carbon monoxide.

As a result of the aforementioned measurement, it is confirmed that in the example 9, an efficiency, an endurance time, and a production amount of CO are high compared with the comparative examples 9-1, 9-2. A reason why the higher efficiency can be obtained in the example 9 compared with the comparative examples 9-1, 9-2 is that optical losses become high in the comparative examples since metal catalysts are formed on entire surfaces of light incident surfaces. In the cell of the example 9, though the efficiency is about the same as that of the comparative example 9-3, the endurance time is higher. As a result, the result of the higher CO production amount is obtained. This is considered because the endurance time is improved since the conductive layer directly under the catalyst layer and the oxide coating film have corrosion resistances against the electrolytic solution in the example 9.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photo-electrochemical cell comprising:
a photoelectric conversion layer having a first surface and a second surface;
a first electrode provided on the first surface of the photoelectric conversion layer;
a first catalyst layer including a plurality of catalyst parts disposed on the first electrode and a transparent dielectric part disposed in a gap between the plurality of catalyst parts;
a second electrode provided on the second surface of the photoelectric conversion layer; and
a second catalyst layer electrically connected to the second electrode.

2. The photo-electrochemical cell according to claim 1, wherein the first catalyst layer further comprises a conductive part disposed on the first electrode, and the plurality of catalyst parts are provided on the conductive part.

3. The photo-electrochemical cell according to claim 2, wherein the conductive part has a tapered shape, and the plurality of catalyst parts are provided along a surface of the tapered-shaped conductive part.

4. The photo-electrochemical cell according to claim 2, wherein the conductive part includes at least one selected from the group consisting of a metal, an alloy including the metal, and a conductive compound containing the metal,
wherein the plurality of catalyst parts are provided on the conductive part, and
wherein the transparent dielectric part includes an insulating compound containing the metal.

5. The photo-electrochemical cell according to claim 4, wherein the conductive part is made of the metal or a nitride of the metal, and
wherein the transparent dielectric part is made of an oxide of the metal.

6. The photo-electrochemical cell according to claim 1, wherein the transparent dielectric part has a thickness of 10 nm or more and 1 mm or less.

7. The photo-electrochemical cell according to claim 1, wherein the plurality of catalyst parts include at least one of a metal and a metal oxide.

8. The photo-electrochemical cell according to claim 1, wherein the first electrode comprises a conductive film having a light transmission property.

9. The photo-electrochemical cell according to claim 1, wherein the plurality of catalyst parts have a dotted or linear planar shape.

10. The photo-electrochemical cell according to claim 1, wherein the plurality of catalyst parts are disposed in a manner that the gap becomes 10 nm or more and 2 mm or less.

11. The photo-electrochemical cell according to claim 1, wherein an oxidation reaction is caused in one of the first and second catalyst layers and a reduction reaction is caused in the other of the first and second catalyst layers.

12. The photo-electrochemical cell according to claim 1, wherein a static contact angle to an electrolytic solution in which the photo-electrochemical cell is immersed, of the first catalyst layer is less than 90 degrees.

13. A method for manufacturing a photo-electrochemical cell comprising:
preparing a stacked body which includes a photoelectric conversion layer having a first surface and a second surface, a first electrode provided on the first surface of the photoelectric layer, and a second electrode provided on the second surface of the photoelectric layer;
forming a first catalyst layer which includes a plurality of catalyst parts and a transparent dielectric part by disposing the plurality of catalyst parts on the first electrode and disposing the transparent dielectric part in a gap between the plurality of catalyst parts; and
providing a second catalyst layer electrically connected to the second electrode.

14. The method according to claim 13,
wherein the forming of the first catalyst layer comprises:
forming a conductive film including at least one selected from the group consisting of a metal, an alloy containing the metal, and a conductive compound containing the metal;
disposing the plurality of catalyst parts on the conductive film, and
forming the transparent dielectric part by selectively oxidizing a portion exposed between the plurality of catalyst parts of the conductive film.

15. A photo-electrochemical reaction device comprising:
an electrolytic bath in which an electrolytic solution is accommodated; and
the photo-electrochemical cell according to claim 1 which is disposed in the electrolytic bath and immersed in the electrolytic solution.

16. The photo-electrochemical reaction device according to claim 15,
wherein the electrolytic bath is divided into two chambers by the photo-electrochemical cell and has an ion migration path including an ion exchange membrane.

* * * * *